(12) United States Patent
Yoshikawa et al.

(10) Patent No.: US 9,511,511 B2
(45) Date of Patent: Dec. 6, 2016

(54) RESIN-COATED SAW WIRE AND CUT ARTICLE

(75) Inventors: Kazuo Yoshikawa, Kobe (JP); Hiroshi Yaguchi, Kobe (JP); Kazuhisa Fujisawa, Kobe (JP); Masanori Anan, Kobe (JP); Akinori Uratsuka, Kobe (JP); Yoshitake Matsushima, Kobe (JP)

(73) Assignee: KOBELCO RESEARCH INSTITUTE, INC., Kobe-shi (JP)

( * ) Notice: Subject to any disclaimer, the term of this patent is extended or adjusted under 35 U.S.C. 154(b) by 117 days.

(21) Appl. No.: 14/237,711

(22) PCT Filed: Aug. 17, 2012

(86) PCT No.: PCT/JP2012/070920
§ 371 (c)(1),
(2), (4) Date: Feb. 7, 2014

(87) PCT Pub. No.: WO2013/024900
PCT Pub. Date: Feb. 21, 2013

(65) Prior Publication Data
US 2014/0165988 A1   Jun. 19, 2014

(30) Foreign Application Priority Data
Aug. 18, 2011   (JP) ................................ 2011-179183

(51) Int. Cl.
*B28D 5/04*    (2006.01)
*B23D 61/18*   (2006.01)
(Continued)

(52) U.S. Cl.
CPC ............ *B28D 5/045* (2013.01); *B23D 61/185* (2013.01); *B28D 5/007* (2013.01); *H01L 21/304* (2013.01);
(Continued)

(58) Field of Classification Search
CPC .......... B28D 5/04; B28D 5/045; H01L 21/304
(Continued)

(56) References Cited

U.S. PATENT DOCUMENTS

| | | | | |
|---|---|---|---|---|
| 6,070,570 A | * | 6/2000 | Ueoka et al. | 125/22 |
| 6,915,796 B2 | * | 7/2005 | Sung | 125/21 |
| 8,720,429 B2 | * | 5/2014 | Lange et al. | 125/21 |

FOREIGN PATENT DOCUMENTS

| | | |
|---|---|---|
| JP | 2000 323736 | 11/2000 |
| JP | 2006 179677 | 7/2006 |
| JP | 2011 005624 | 1/2011 |

OTHER PUBLICATIONS

International Search Report Issued Oct. 9, 2012 in PCT/JP12/070920 Filed Aug. 17, 2012.
(Continued)

*Primary Examiner* — Robert Rose
(74) *Attorney, Agent, or Firm* — Oblon, McClelland, Maier & Neustadt, L.L.P.

(57) ABSTRACT

Provided is a resin-coated saw wire that, when used to cut a workpiece, has a shallow depth of a damaged layer and can give a cut article having a smooth surface. The resin-coated saw wire is used in cutting of the workpiece using a sawing machine and includes a steel wire and a resin coating covering the steel wire surface. The resin coating contains substantially no abrasive grain, has a hardness at 120° C. of 0.07 GPa or more, and has a hardness controlled so as to prevent abrasive grains from coming into the resin coating, which abrasive grains are sprayed during workpiece cutting.

19 Claims, 17 Drawing Sheets

(51) Int. Cl.
*H01L 21/304* (2006.01)
*B28D 5/00* (2006.01)
(52) U.S. Cl.
CPC ....... *Y10T 428/24479* (2015.01); *Y10T 428/31* (2015.01)
(58) Field of Classification Search
USPC ................... 125/16.02, 21, 22; 451/168, 296
See application file for complete search history.

(56) References Cited

OTHER PUBLICATIONS

Written Opinion Issued Oct. 9, 2012 in PCT/JP12/070920 Filed Aug. 17, 2012.

* cited by examiner

THICKNESS MEASUREMENT POINTS
20D×60W

|  | 5 | 15 | 30 | 45 | 55 | mm |
|---|---|---|---|---|---|---|
| 1 | 1 | 2 | 3 | 4 | 5 | |
| 10 | 6 | 7 | 8 | 9 | 10 | |
| 19 | 11 | 12 | 13 | 14 | 15 | |
| mm | | | | | | |

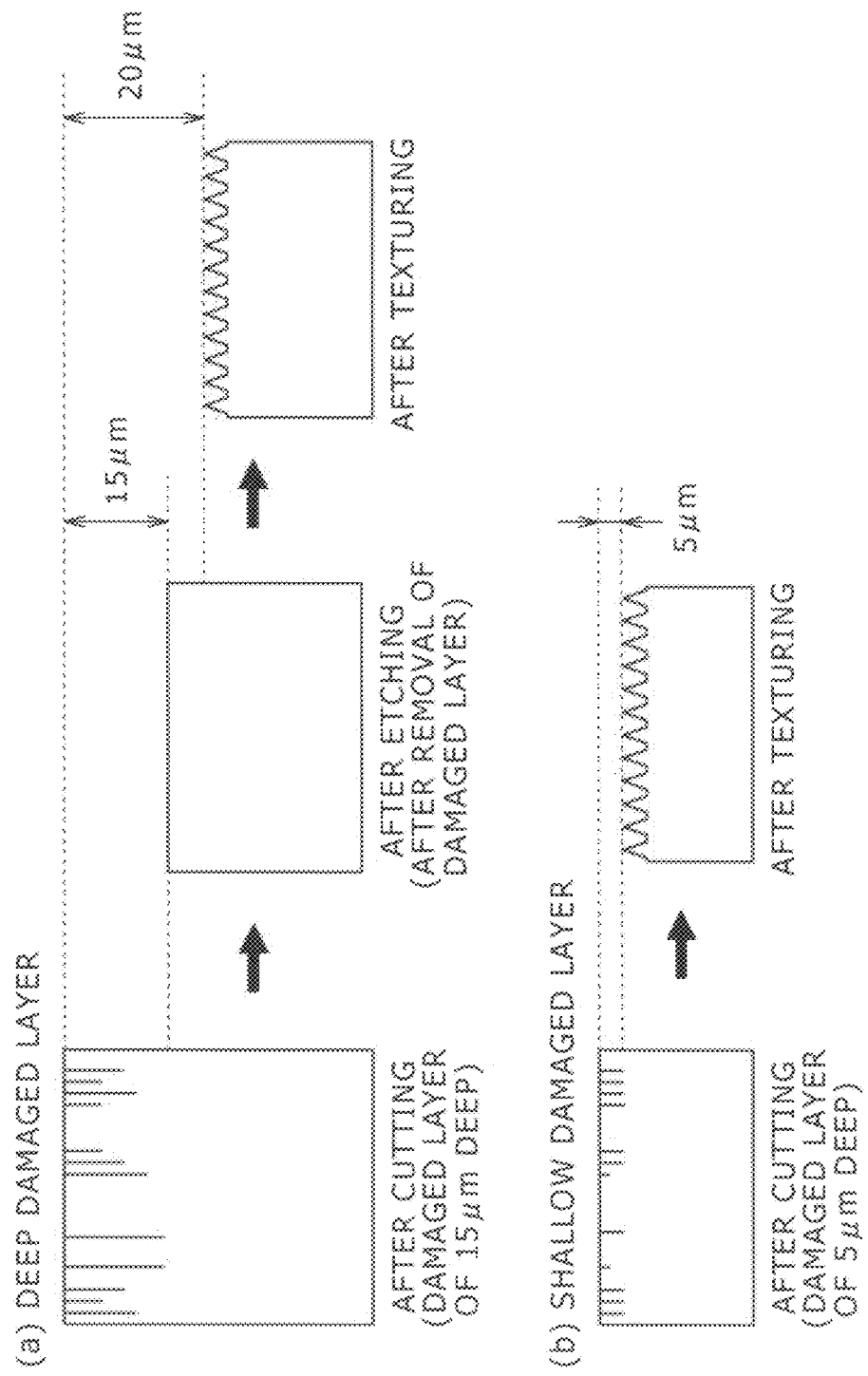

RESIN-COATED SAW WIRE AND CUT ARTICLE

TECHNICAL FIELD

The present invention generally relates to saw wires for use in cutting of a workpiece of typically silicon or ceramic using a sawing machine; and to cut articles obtained by cutting workpieces with the saw wires. Specifically, the present invention relates to resin-coated saw wires each including a steel wire and a resin coating covering the surface of the steel wire and having a predetermined hardness; and to cut articles obtained by using the saw wires. Such cut articles are also called "wafer(s)".

BACKGROUND ART

A workpiece typically of silicon or a ceramic is cut using a sawing machine assembled with a saw wire. The saw wire travels in one direction or in two directions (in a reciprocating direction) and, when brought into contact with the workpiece, can slice the workpiece in an arbitrary width.

Known techniques for cutting a workpiece include a technique of cutting the workpiece while spraying, on a saw wire, a slurry containing abrasive grains (customary technique 1), where such abrasive grains are hereinafter also referred to as "loose abrasive grains"; and a technique of cutting the workpiece using a saw wire including a base wire bearing fixed abrasive grains (fixed-abrasive wire), where the abrasive grains are adhered and fixed to the surface of the base wire (customary technique 2). According to the former technique, the workpiece cutting is performed by introducing the loose abrasive grains contained in the sprayed slurry into between the workpiece and the saw wire, thereby accelerating the abrasion of the workpiece, and accelerating grinding of the workpiece. In turn, according to the latter technique, the workpiece cutting is performed by allowing the abrasive grains fixed to the surface to accelerate the abrasion of the saw wire and the workpiece, and thereby accelerating the grinding of the workpiece.

Patent Literature 1 discloses a technique of preparing a wire including a steel wire (e.g., a high-carbon steel) and an abrasive-grain-carrier resin coating covering the circumferential surface of the steel wire; and cutting a workpiece using the wire while embedding sprayed abrasive grains in the resin coating (customary technique 3). Patent Literature 1 describes that "The wire-saw cutting using loose abrasive grains involves coating the wire circumferential surface with an abrasive-grain-carrier resin coating, spraying loose abrasive grains, and bringing the loose abrasive grains into a region where the wire and the workpiece are in contact with each other while allowing the sprayed loose abrasive grains to intrude into the abrasive-grain-carrier resin coating. When the wire-saw cutting according to this technique is performed, the loose abrasive grains intrude into the abrasive-grain-carrier resin coating being relatively softer than the abrasive grains and, in this state, are brought into between the workpiece and the saw wire. This allows the saw wire to carry the loose abrasive grains more satisfactorily and can stably bring (introduce) the loose abrasive grains into between the workpiece and saw wire. The saw wire according to the present invention, therefore, enables production of high quality products (sliced articles) in high yields." In addition, Patent Literature 1 also describes that "fine particles may be incorporated in the abrasive-grain-carrier resin coating, which fine particles are made from a hard inorganic substance such as zirconia or alumina"; and refers to that "this suppresses the abrasion of the abrasive-grain-carrier resin coating itself and provides an expectation of the abrasive-grain-carrier resin coating to have further better carrying capability of the loose abrasive grains, because the abrasive-grain-carrier resin coating has regions having different hardness, i.e., a region of the resin coating alone and a region with the inorganic fine particles."

Cut articles prepared by cutting silicon with a saw wire are used typically as solar cell substrates. The resulting cut articles, however, may bear a damaged layer (also called "affected layer") formed on a cut surface upon cutting. Patent Literature 2 points out that the damaged layer, if remaining, may adversely affect junction quality with respect to the substrate and inhibit the solar cell from exhibiting sufficient properties as a solar cell. To prevent this, the damaged layer should be removed.

CITATION LIST

Patent Literature

Patent literature 1: Japanese Unexamined Patent Application Publication (JP-A) No. 2006-179677
Patent literature 2: JP-A No. 2000-323736

SUMMARY OF INVENTION

Technical Problem

FIG. 1 illustrates how to cut a workpiece by preparing a steel wire as a saw wire, spraying loose abrasive grains on the steel wire, and cutting the workpiece while bringing the abrasive grains into between the saw wire and the workpiece, as in the customary technique 1. After investigations, the present inventors found that this technique causes the formation of a damaged layer also in the workpiece cut surface, because the abrasive grains are brought not only into a direction into which the steel wire cuts the workpiece, but also into between the steel wire and the workpiece cut surface (workpiece wall surface), and this causes grinding also on the workpiece cut surface. The present inventors also found that the technique causes the cut surface to have a high surface roughness.

FIG. 2 illustrates how to cut a workpiece by cutting the workpiece with a saw wire bearing abrasive grains fixed to the surface thereof or by cutting the workpiece while embedding abrasive grains in a saw wire, as in the customary techniques 2 and 3. After investigations, the present inventors found that these techniques also cause the cut surface to bear a deep damaged layer and to have a high surface roughness, because the workpieces cut surface (workpiece wall surface) also undergoes grinding, as in the technique illustrated in FIG. 1.

The customary techniques cause a damaged layer to be formed in the cut surface of the cut article as illustrated in FIGS. 1 and 2. The damaged layer should be removed in a downstream step, as pointed out by Patent literature 2. Omission of this step of removing the damaged layer allows the cut article to have a higher yield and to exhibit better productivity.

The abrasive grains for use in cutting not only cause a damaged layer to be formed in the cut surface but also cause the cut surface to have irregularities and to be rough. The cut article, however, should generally have a smooth surface and is subjected to etching in a downstream step. Omission of the etching step allows the cut article to exhibit better productivity.

How the damaged layer removing step and the omission of the downstream etching step are useful will be described in detail with reference to concrete examples.

If a cut article bearing a damaged layer in the cut surface is used as a solar cell substrate with the damaged layer as remaining, the resulting solar cell suffers from a low conversion efficiency, because an electron and a hole generated by the action of sunlight recombine with each other in the damaged layer. To prevent this, the damaged layer formed in the cut surface should be completely removed by etching before the workpiece is sent to the solar cell production process.

Such solar cell substrate has protrusions and depressions called textures on its surface so as to scatter the sunlight. The textures are formed by an etching process using a dedicated etchant. Etching in such texturing step is performed generally to a quantity (depth) of from 5 to 10 µm. However, etching in a smaller quantity is demanded to give a substrate as thick as possible, because the solar cell has an increasing conversion efficiency with an increasing thickness of the substrate. To meet this demand, the etching quantity recently approaches the minimum level, i.e., 5 µm.

FIGS. 17(a) and 17(b) depict schematic views illustrating how a cut article obtained by cutting a workpiece with a saw wire is processed into a solar cell substrate. FIG. 17(a) illustrates the case where the cut article has a 15-µm deep damaged layer; and FIG. 17(b) illustrates the case where the cut article has a 5-µm deep damaged layer, respectively.

When the cut article has a deep damaged layer having a depth of 15 µm per one side thereof the process should include initial etching to remove the damaged layer and subsequent etching to create textures (to texture the surface), as illustrated in FIG. 17(a).

When the cut article has a shallow damaged layer having a depth of 5 µm per one side thereof as illustrated in FIG. 17(b), the etching step to texture the surface can also remove the damaged layer, and this eliminates the need of etching to remove the damaged layer and contributes to significantly better productivity.

A surface to be textured should be smoothed before the texturing. When the etching to remove the damaged layer is performed, the cut article has a smooth surface as illustrated in FIG. 17(a). However, when the step of removing the damaged layer is omitted as illustrated in FIG. 17(b), the cut article is textured as with the surface quality immediately after cutting. For this reason, it is recommended to control the cut surface immediately after cutting to have a surface roughness (Ra) of typically 0.5 µm or less.

The solar cell has an increasing conversion efficiency with an increasing thickness of the substrate, as described above. However, reduction in thickness of the substrate (for example, to about 0.1 mm) is effective for the reduction of the production cost. In consideration of such balance between the conversion efficiency and the production cost of the solar cell, substrates having a thickness of from about 0.13 to 0.16 mm after removing the damaged layer and texturing the surface are widely used.

Accordingly, when the cut article has a damaged layer having a depth of typically 15 µm per one side thereof as illustrated in FIG. 17(a), the resulting cut article becomes thinner than the thickness immediately after cutting by at most about 40 µm, because the cut article is subjected to initial etching to remove the both sides of the cut article in a total amount of at most about 30 µm so as to remove the damaged layers, and subsequently subjected to etching on the both sides by a total amount of at most about 10 µm so as to texture the surfaces. In contrast, when the cut article is allowed to have a damaged layer having a depth of typically 5 µm per one side of the cut surface as illustrated in FIG. 17(b), the resulting cut article can be used as a solar cell substrate merely after removing the both sides of the cut surface by a total amount of at most about 10 µm with respect to the thickness of the cut article immediately after cutting.

This indicates that a cut article immediately after cutting can have a smaller thickness, when a shallow damaged layer is to be formed in the cut surface. Specifically, when a solar cell substrate having a thickness of 0.14 mm is to be produced and if the cut article has a damaged layer having a thickness of 15 µm per one side thereof the cut article immediately after cutting should have a thickness of about 0.18 mm, because the both sides of the cut article should be removed by at most about 40 µm for removing the damaged layer and for texturing the surface, as described above. However, when the cut article has a damaged layer having a depth controlled to be about 5 µm or less per one side thereof, the cut article immediately after cutting may have a thickness of about 0.15 mm. Accordingly, when a 300-mm long silicon ingot is cut with a kerf loss of 0.12 mm to produce cut articles, only 1000 cut articles are obtained when the cut article immediately after cutting has a thickness of 0.18 mm; whereas 1111 cut articles can be obtained when the cut article immediately after cutting has a thickness of 0.15 mm. The cut articles can be produced with a reduced cost by the difference in number of manufactured cut articles.

A workpiece-cutting saw wire that enables omission of the damaged layer removing step and downstream etching step, when provided, contributes to significant improvements in yield, productivity, and other conditions of a cut article obtained by using the saw wire, as described in detail above. A demand has been made to provide such technique.

The present invention has been made under these circumstances, and an object thereof is to provide a resin-coated saw wire which is used for cutting a workpiece and can give a cut article bearing a damaged layer with a shallow depth and having a smooth surface.

Solution to Problem

The present invention provides resin-coated saw wires and cut articles as follows.

(1) A resin-coated saw wire to be assembled into a sawing machine and to be used in cutting of a workpiece with the sawing machine. The resin-coated saw wire includes:
a steel wire; and
a resin coating covering a surface of the steel wire, containing substantially no abrasive grain, and having a hardness of 0.07 GPa or more at 120° C., in which;
the hardness of the resin coating is controlled so as to resist intrusion of abrasive grains into the resin coating, the abrasive grains sprayed during cutting of the workpiece.

(2) The resin-coated saw wire according to (1), in which the resin coating has a thickness of from 2 to 15 µm.

(3) The resin-coated saw wire according to (1), in which the steel wire has a diameter of 130 µm or less.

(4) The resin-coated saw wire according to (2), in which the steel wire has a diameter of 130 µm or less.

(5) The resin-coated saw wire according to (1), in which the resin includes one selected from the group consisting of polyurethanes, polyamide-imides, and polyimides.

(6) The resin-coated saw wire according to (2), in which the resin includes one selected from the group consisting of polyurethanes, polyamide-imides, and polyimides.

(7) The resin-coated saw wire according to (3), in which the resin includes one selected from the group consisting of polyurethanes, polyamide-imides, and polyimides.

(8) The resin-coated saw wire according to (4), in which the resin includes one selected from the group consisting of polyurethanes, polyamide-imides, and polyimides.

(9) A cut article obtained through cutting of a workpiece by spraying abrasive grains on the resin-coated saw wire according to any one of (1) to (8); and bringing the abrasive grains in a direction into which the resin-coated saw wire cuts the workpiece while preventing, by the action of the resin coating, the abrasive grains from coming into between a cut surface of the workpiece and the resin-coated saw wire, in which a damaged layer in the workpiece cut surface has a depth of 5 μm or less.

(10) The cut article according to (9), in which the workpiece cut surface has a surface roughness of 0.5 μm or less.

(11) The cut article according to (9), in which a kerf loss for the workpiece is from 1 to 1.10 times the diameter of the resin-coated saw wire.

(12) The cut article according to (10), in which a kerf loss for the workpiece is from 1 to 1.10 times the diameter of the resin-coated saw wire.

(13) The cut article according to (9), having a total thickness variation (TTV) of 20 μm or less.

(14) The cut article according to (10), having a total thickness variation (TTV) of 20 μm or less.

(15) The cut article according to (11), having a total thickness variation (TTV) of 20 μm or less.

(16) The cut article according to (12), having a total thickness variation (TTV) of 20 μm or less.

Advantageous Effects of Invention

The resin-coated saw wire according to the present invention includes a steel wire (base wire) and a resin coating. The resin coating covers the surface of the steel wire, contains substantially no abrasive grain, and has a hardness controlled to a predetermined level. The resin-coated saw wire therefore can cut a workpiece while bringing abrasive grains in a direction into which the resin-coated saw wire cuts the workpiece, but while preventing, by the action of the resin coating, the abrasive grains from coming into between a cut surface and the resin-coated saw wire. This suppresses the formation of a damaged layer in the surface of the cut article. The resin-coated saw wire, when used to cut a workpiece, can give a cut article having a smooth surface because the saw wire allows the workpiece to have a smaller surface roughness on the cut surface. This enables omission of an etching step as a downstream step for removing the damaged layer and for smoothing the surface and contributes to better productivity of the cut article.

In addition, the resin-coated saw wire according to the present invention, when used, suppresses the introduction of the abrasive grains into between the cut surface and the resin-coated saw wire, can reduce the kerf loss for the workpiece, and gives a cut article with better productivity. The resin-coated saw wire can also control the cut article to have a small total thickness variation (TTV), which variation is one of indices of flatness (smoothness).

BRIEF DESCRIPTION OF DRAWINGS

FIGS. 17(a) and 17(b) are schematic views respectively illustrating how to process a cut article into a solar cell substrate, which cut article is obtained by cutting a workpiece with a saw wire.

DESCRIPTION OF EMBODIMENTS

After intensive investigations to achieve the objects, the present inventors have found a specific resin-coated saw wire which includes a steel wire coated with a resin coating, contains substantially no abrasive grain, and has a hardness of the resin coating controlled to be 0.07 GPa or more at 120° C. The present inventors have found that the saw wire, when used to cut a workpiece, can give a cut article with a smaller kerf loss upon cutting, which cut article has a damaged layer with a shallow depth and has a smooth surface [has a small arithmetic mean surface roughness (Ra) and a low TTV, where TTV is an index of wafer flatness]. The present invention has been made based on these findings.

Figure 1:
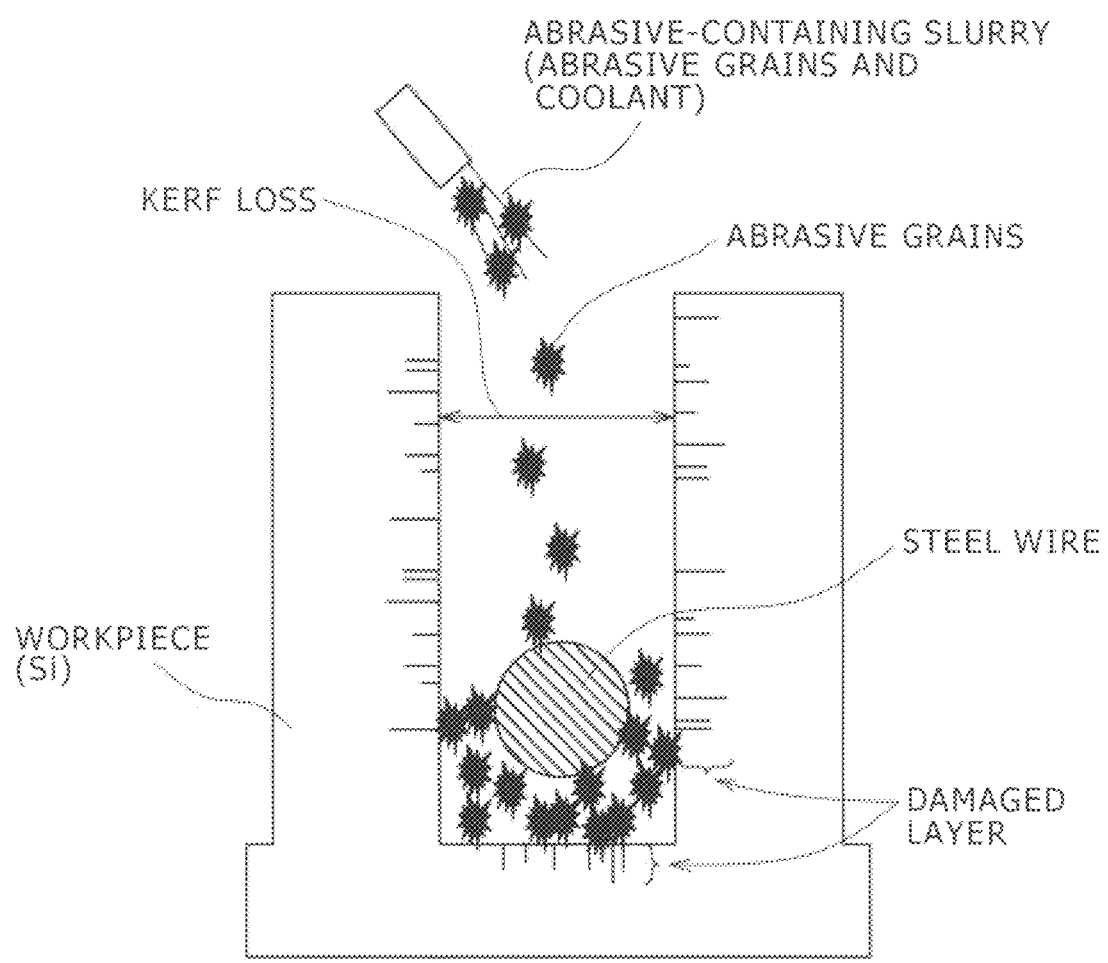
FIG. 1 is a schematic view illustrating how to cut a workpiece with a steel wire.
Figure 2:
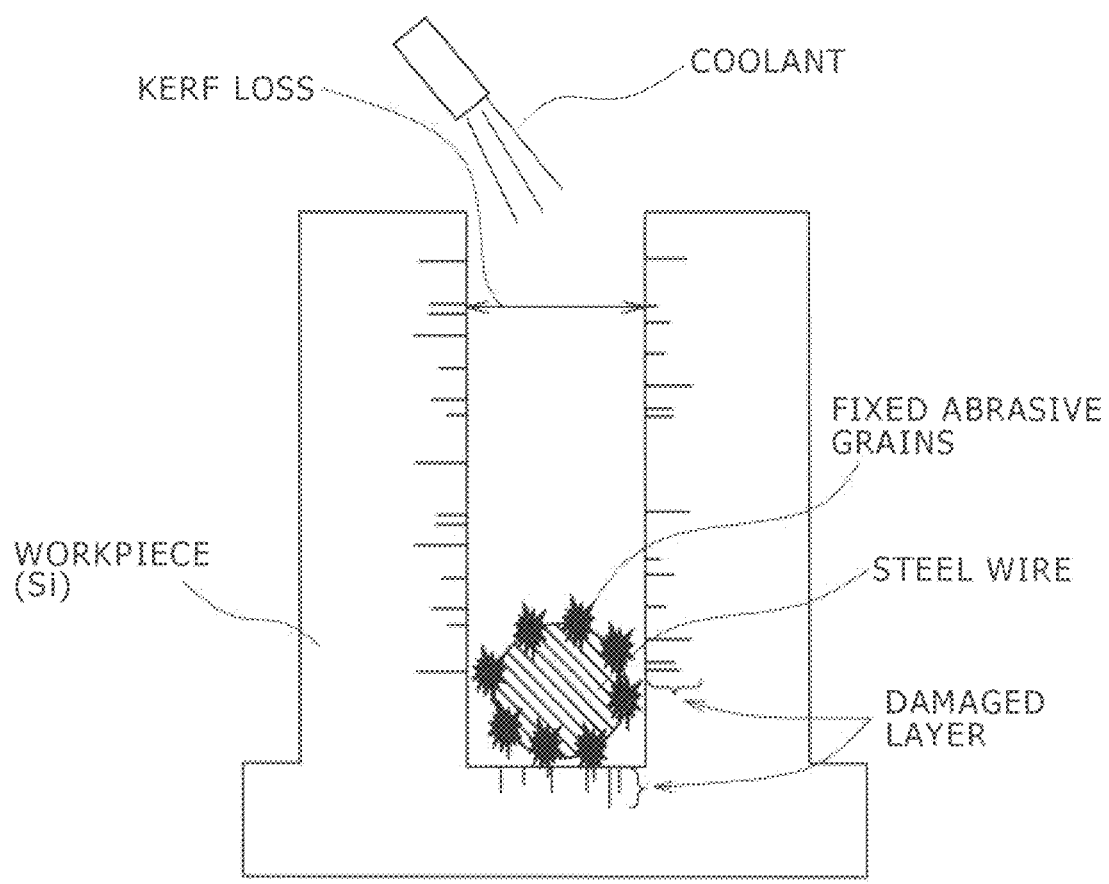
FIG. 2 is a schematic view illustrating how to cut a workpiece with a steel wire bearing fixed abrasive grains.

When a workpiece is cut with a steel wire while spraying abrasive grains on the saw wire or a fixed-abrasive steel wire as a saw wire, a deep damaged layer is formed in the workpiece cut surface, and the resulting cut surface has a high surface roughness, as illustrated in FIGS. 1 and 2.

Figure 3:
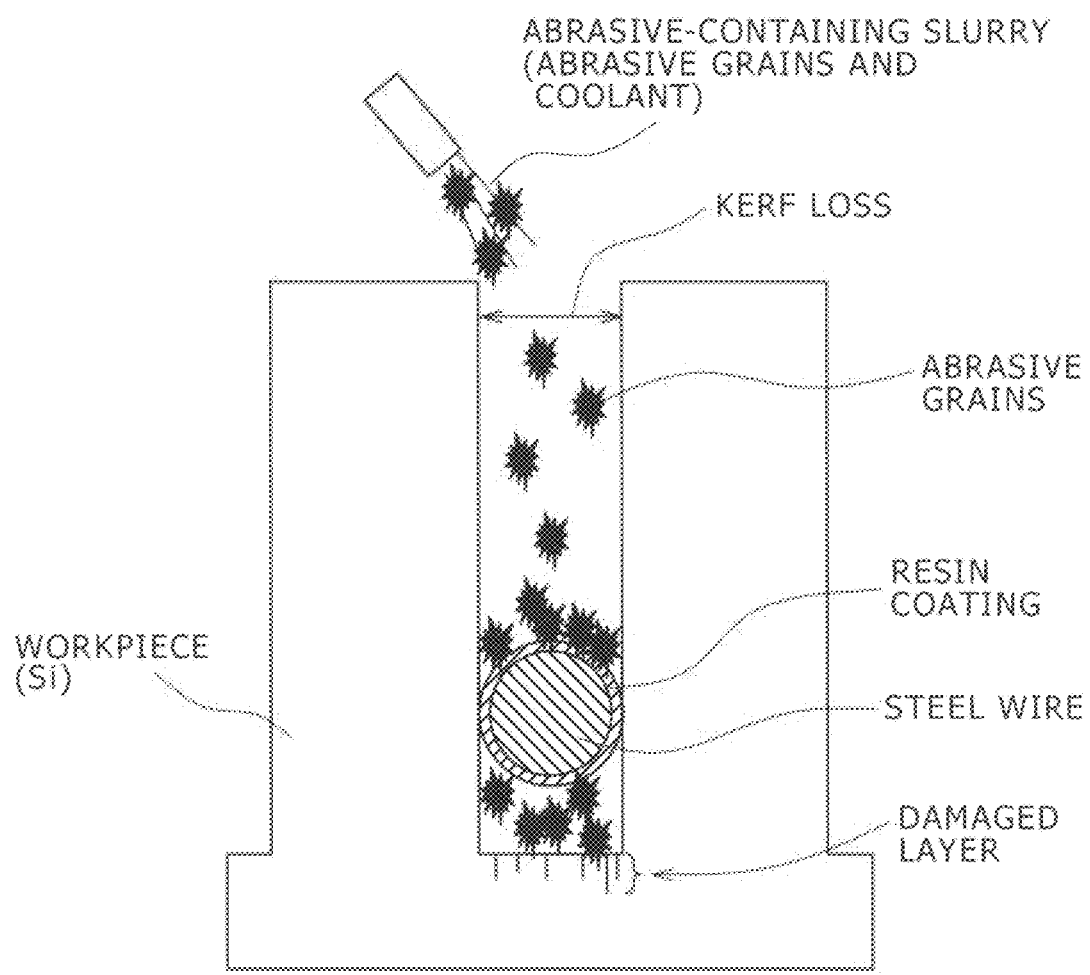
FIG. 3 is a schematic view illustrating how to cut a workpiece with a resin-coated saw wire.

In contrast, the resin-coated saw wire according to the present invention, when used, helps the cut article to have a shallower damaged layer and to have a smooth surface. How to cut a workpiece with the resin-coated saw wire will be illustrated with reference to FIG. 3. On the surface of a steel wire as a base wire, the resin-coated saw wire according to the present invention contains substantially no abrasive grain, but bears a resin coating having a predetermined hardness. Upon workpiece cutting, the surface resin coating comes in intimate contact with the cut surface and prevents abrasive grains from coming into between the saw wire and the workpiece cut surface, as illustrated in FIG. 3. This allows the cut surface to resist the formation of a damaged layer and to readily have a smooth surface.

If a resin coating covering a steel wire surface has a low hardness (is soft), abrasive grains intrude into the resin as in the technique disclosed in Patent Literature 1 (customary technique 3). Thus, the abrasive grains are present between the resin-coated saw wire and the workpiece to form a damaged layer in the cut surface, as illustrated in FIG. 2. As is described above, Patent Literature 1 discloses the technique for stably bringing (introducing) loose abrasive grains into between the workpiece and the saw wire. According to this technique, the abrasive-grain-carrier resin coating coated on the wire circumferential surface is designed to be a coating relatively softer than the loose abrasive grains so as to have better capability of carrying the loose abrasive grains. In addition, the technique disclosed in Patent Literature 1 employs inorganic fine particles mixed in the abrasive-grain-carrier resin coating so as to provide further better capability of carrying the loose abrasive grains. According to the technique disclosed in Patent Literature 1, a significantly larger amount of loose abrasive grains is present between the workpiece and the saw wire. This technique may be useful as a technique for improving slicing performance from early stages of slicing. However, the technique inevitably suffers from the formation of a damaged layer in the cut surface. Upon workpiece cutting, the introduced loose abrasive grains shave the workpiece cut surface to form a deep damaged layer and cause remarkable reduction in productivity and yield. As is described above, the technique disclosed in Patent Literature 1 and the present invention entirely differ in objects from each other and thereby substantially significantly differ in resin coating hardness from each other. There is no room for Patent Literature 1 to suggest the concept that the resin coating is designed to have a higher hardness at a predetermined level or more as in the present invention.

In view of these circumstances, the present inventors have found that suitable control of the hardness of a resin coating covering a steel wire surface can prevent abrasive grains from intruding into the resin surface, helps the workpiece, when it is cut with the resin-coated saw wire, to have a damaged layer having a shallow depth in the cut surface, to have a small surface roughness of the cut surface, and to have a reduced thickness variation (TTV). The present invention has been made based on these findings.

When a workpiece is cut with the resin-coated saw wire having such a suitably controlled surface hardness while spraying abrasive grains on the saw wire, the abrasive grains are introduced into a direction into which the resin-coated saw wire cuts the workpiece, but are prevented by the resin from coming into between the cut surface and the resin-coated saw wire. Thus, the workpiece cut surface becomes smooth with little formation of damaged layer therein, as illustrated in FIG. 3. The present invention therefore enables the omission of an etching step for removing the damaged layer and provides better productivity.

Initially, the resin-coated saw wire according to the present invention will be illustrated.

As is described above, the resin-coated saw wire according to the present invention has a feature that a base steel wire surface contains substantially no abrasive grain, but is covered with a resin coating having a hardness of 0.07 GPa or more at 120° C. The resin coating has such controlled hardness as to suppress the intrusion of abrasive grains into the resin coating, which abrasive grains are sprayed during workpiece cutting.

Specifically, when a workpiece is cut with the resin-coated saw wire, the wire travels at a wire speed (linear velocity) of typically 500 m/min and cuts the workpiece while coming in contact with the abrasive grains or with the workpiece. The wire surface therefore probably has a temperature of higher than 100° C. due to temperature rise by the action of frictional heat. In actual, evaporation of water contained in the slurry may be observed during cutting. This indicates that the resin coating should be at least highly resistant to heat at such elevated temperatures.

Why the resin-coated saw wire according to the present invention is specified to have a hardness, particularly as measured at 120° C., of the resin coating covering the steel wire will be described with reference to FIGS. 4A, 4B, and 4C.

Figure 4A:
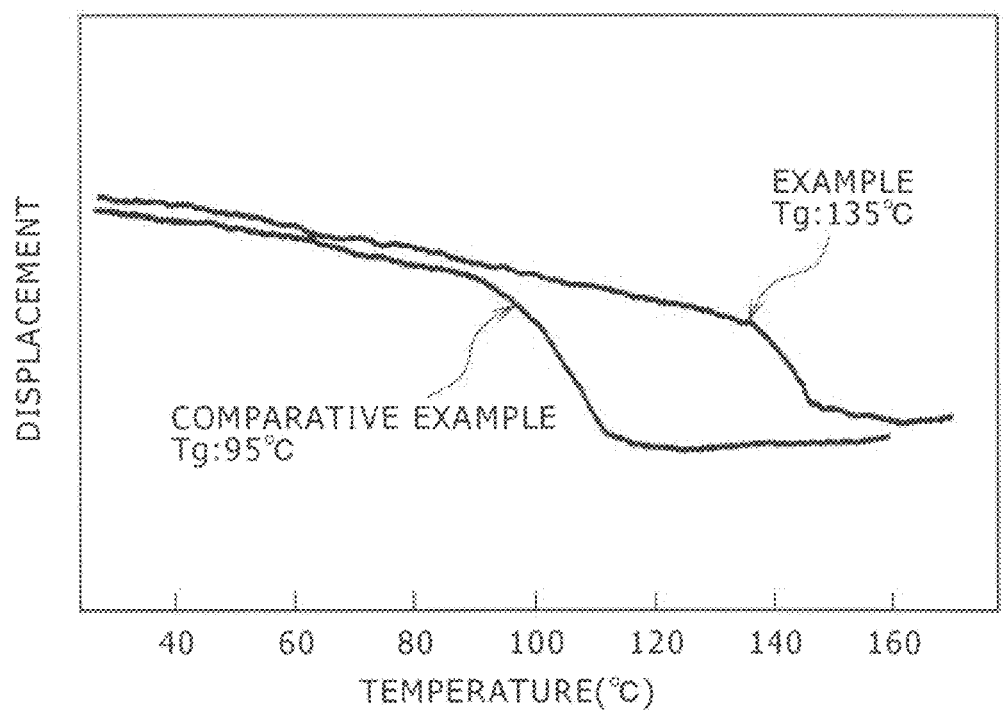
FIG. 4A is a graph illustrating how the hardness of a resin coating varies depending on the temperature, as measured by thermomechanical analysis (TMA).

FIG. 4A illustrates measurement data of how the needle displacement (corresponding to resin coating hardness) varies depending on the heating temperature (namely, how the resin coating hardness varies depending on the temperature). Specifically, an identical polyurethane varnish for wires is applied to a steel wire surface while changing conditions such as number of varnish coating procedures to give saw wires bearing resin coatings, and the saw wires are heated at different temperatures to cure the resin coatings at different curing temperatures as illustrated in FIG. 4A. The glass transition temperatures (Tg) of the resin coatings are measured by thermomechanical analysis (TMA), in which the displacement of the needle is determined. The thermomechanical analysis (TMA) is a measuring method prescribed in Japanese Industrial Standard (JIS) K 7196. According to this measuring method, a needle is brought into contact with a specimen (resin coating); the resin coating is gradually risen in temperature and becomes softer; and how the needle intrudes into the resin coating with an elevating temperature is recorded by measuring the displacement of the needle. Thus, how the resin coating hardness varies depending on the temperature is relatively measured. A temperature at which the resin coating hardness abruptly decreases with an elevating heating temperature is called Tg (glass transition temperature or softening temperature) and is one of indices for the evaluation of heat resistance of the resin coating. FIG. 4A illustrates the data of measurement in which a 1-gram-force load is applied to a 10-mm long specimen, the temperature of the specimen is raised from room temperature at a rate of 5° C. per minute, and the displacement of the specimen is measured with a thermomechanical analyzer.

In FIG. 4A, data indicated as "Example" are data of Test No. 4 in after-mentioned Table 1; and data indicated as "Comparative Example" are data of Test No. 10 in Table 1. FIG. 4B (Comparative Example) and FIG. 4C (Example) illustrate the resin surfaces after cutting as observed by preparing resin-coated saw wires coated with these resin coatings, and performing cutting experiments by the procedure described in Experimental Example mentioned later. FIG. 4B demonstrates that, when the saw wire of Comparative Example coated with the resin coating having a Tg of 95° C. was used, a large number of diamond abrasive grains intruded into the resin coating after cutting; whereas FIG. 4C demonstrates that, when the saw wire of Example coated with the resin coating having a Tg of 135° C. was used, substantially no intrusion of the abrasive grains in the resin coating after cutting was observed. Specifically, when a resin-coated saw wire having a resin coating with a hardness as controlled based on the hardness measured at about 100° C. as in Comparative Example is used, the resin coating may not endure frictional heat generated in actual workpiece cutting and may become soft. In this case, the abrasive grains readily intrude into the resin coating, and this causes the cut surface to have a deep damaged layer and to be rough, and causes large cutting loss of the cut article. The experimental data indicate that a resin-coated saw wire to obtain a desired cut article should extremely significantly employ not a resin coating simply having a high hardness, but a resin coating having a suitably controlled hardness at a predetermined temperature. Accordingly, the present invention controls the hardness of the resin coating by the hardness at 120° C., based on the experimental data.

Specifically, the resin coating has a hardness of 0.07 GPa or more, and preferably 0.1 GPa or more, as measured at 120° C. Control of the resin coating hardness measured at 120° C. as above suppresses the number of abrasive grains intruded into the resin coating surface to 20 or less per 50 μm by 200 μm area. This allows the cut article to have a shallow damaged layer and to have a smooth surface. The resin coating preferably has a hardness of typically 0.5 GPa or less as measured at 120° C. This is because the resin coating, if being excessively hard, may resist intimate contact with the cut surface during workpiece cutting, and this may cause the abrasive grains to come into between the saw wire and the workpiece cut surface to cause a deep damaged layer in the cut surface. The resin coating more preferably has a hardness of 0.4 GPa or less as measured at 120° C.

The resin coating hardness can be measured typically by a nanoindentation technique.

It is important that the resin coating contains substantially no abrasive grain. This is because abrasive grains, if contained in the resin coating, cause the formation of a deep damaged layer in the cut surface.

The resin coating is formed so as to introduce abrasive grains (loose abrasive grains) sprayed during workpiece cutting into a direction in which the resin-coated saw wire cuts the workpiece while suppressing the intrusion of the loose abrasive grains into the resin coating and preventing the introduction of the loose abrasive grains into between the cut surface and the resin-coated saw wire, as described above. Specifically, the resin-coated saw wire according to the present invention, when used to cut a workpiece, can suppress the intrusion of loose abrasive grains into the resin coating, the abrasive grains sprayed upon workpiece cutting, and can thereby prevent abrasive grains from intruding and thereby forming a damaged layer in the cut surface. This is because the resin coating is in intimate contact with the cut surface during workpiece cutting. The resin coating having a predetermined hardness comes into intimate contact with the cut surface, thereby suppresses the introduction of the loose abrasive grains into between the cut surface and the resin-coated saw wire, and allows a damaged layer formed in the cut surface to have a shallow depth. The present invention therefore enables the omission of the etching step for removing the damaged layer and contributes to better productivity. In contrast, the resin-coated saw wire allows the loose abrasive grains to be introduced into a direction into which the resin-coated saw wire cuts the workpiece. The introduced loose abrasive grains do not intrude into the resin coating, but build up between the workpiece and the resin-coated saw wire. This contributes to higher workpiece cutting efficiency and better productivity.

The resin constituting the resin coating usable herein is exemplified by thermosetting resins and thermoplastic resins, of which preferred are phenolic resins, amide resins, imide resins, polyamide-imides, epoxy resins, polyurethanes, formal, ABS resins, poly(vinyl chloride)s, and polyesters. Among them, polyimides, polyamide-imides, and polyurethanes are preferably employed because they exhibit good formability upon application to form a resin coating and the retention in hardness at high temperatures; of which polyamide-imides are most preferably employed.

The resin coating may be formed by applying a commercially available varnish onto a steel wire (as mentioned below); and heating the coated varnish. As used herein the term "varnish" refers to a coating material as a solution of a resin typically in a drying oil or organic solvent. The varnish may be applied repeatedly in several to several tens of installments, and this allows the adjustment of the resin coating thickness. Control of the hardness at 120° C. within a desired range may be performed typically by changing the types of the coating resin and the curing agent (crosslinking agent) and/or changing the heating temperature (curing temperature). Even when an identical varnish is used control of the resin coating hardness at 120° C. can also be performed by changing any of coating conditions such as number of varnish coating procedures, the type of the curing agent, and the heating temperature.

The steel wire (base wire) is preferably a steel wire having a tensile strength of 3000 MPa or more. The steel wire having a tensile strength of 3000 MPa or more usable herein is exemplified by high-carbon steel wires containing carbon (C) in a content of from 0.5% to 1.2%. The high-carbon steel wires usable herein are exemplified by steel wire rods prescribed in JIS G 3502.

The steel wire preferably has a diameter (base wire diameter) to be minimized within such a range as to endure the load applied during cutting and has a diameter of typically 130 μm or less, preferably 110 μm or less, and more preferably 100 μm or less. Reduction in diameter of the steel wire can reduce the kerf loss and contributes to better productivity of the cut article. However, the steel wire, if having an excessively small diameter, may suffer from increasing risk of break. To prevent this, the steel wire desirably has a diameter of 50 μm or more.

The varnish for use in the present invention is exemplified by varnishes for enameled wires commercially available typically from TOTOKU TORYO CO., LTD. and Ube Industries, Ltd.; and varnishes for electric wires commercially available from KYOCERA Chemical Corporation.

Examples of the varnishes for enameled wires are as follows:

(a) polyurethane varnishes including commercial products of TOTOKU TORYO CO., LTD., such as "TPU F1", "TPU F2-NC", "TPU F2-NCA", "TPU 6200", "TPU 5100", "TPU 5200", "TPU 5700", "TPU K5 132", "TPU 3000K", and "TPU 3000EA";

(b) polyamide-imide varnishes including commercial products of TOTOKU TORYO CO., LTD., such as "Neoheat AI-00C";

(c) polyimide varnishes including commercial products of Ube Industries, Ltd., such as "U-varnish";

(d) polyester varnishes including commercial products of TOTOKU TORYO CO., LTD., such as "LITON 2100S", "LITON 2100P", "LITON 3100F", "LITON 3200BF", "LITON 3300", "LIMN 3300KF", "LITON 3500SLD", and "Neoheat 8200K2"; and (e) polyesterimide varnishes including commercial products of TOTOKU TORYO CO., LTD., such as "Neoheat 8600A", "Neoheat 8600AY", "Neoheat 8600", "Neaheat 8600H3", "Neoheat 8625", and "Neoheat 8600E2".

The varnishes for electric wires usable herein are exemplified by heat-resistant urethane varnishes for copper wires, including epoxy-modified formal resins such as "TVE 5160-27"; formal varnishes for copper wires, including polyvinylformal resins such as "TVE 5225A"; heat-resistant formal varnishes for copper wires, including epoxy-modified formal resins such as "TVE 5230-27"; and polyester varnishes for copper wires, including polyester resins such as "TVE 5350 Series", each of which is a commercial product available from KYOCERA Chemical Corporation.

After being coated with the varnish, the steel wire surface is heated at a temperature of typically 250° C. or higher (preferably 300° C. or higher) to thermally cure the resin to form a resin coating and is thereby coated with the resin coating. As is described above, the hardness of the resin coating at 120° C. can be adjusted typically by using different types of a coating resin and a curing agent (crosslinking agent) and/or forming the resin coating under different conditions (e.g., number of varnish coating procedures and heating temperature after coating).

The resin coating may have a thickness of typically preferably from 2 to 15 µm. An excessively thin resin coating may be difficult to be formed uniformly on the steel wire. In addition, the resin coating, if being excessively thin, may be worn at early stages of cutting to cause the base wire (steel wire) to be exposed, and this may cause the base wire to be abraded and to readily break. To prevent these, the resin coating has a thickness of preferably 2 µm or more, more preferably 3 µm or more, and particularly preferably 4 µm or more. However, the resin coating, if being excessively thick, may cause the resin-coated saw wire to have a larger diameter, and this may cause a larger kerf loss and inferior productivity. In this case, the resin occupies an excessively large percentage of the entire resin-coated saw wire, and this may cause the entire resin-coated saw wire to have insufficient strengths. This saw wire, if traveling at a higher wire speed for better productivity, may therefore readily break. To prevent these, the resin coating has a thickness of preferably 15 µm or less, and more preferably 13 µm or less, and particularly preferably 10 µm or less.

The resin-coated saw wire may have a diameter (outer diameter of the wire) not critical, but generally from about 100 to about 300 µm, and preferably from 100 to 150 µm.

The workpiece to be cut with the resin-coated saw wire usable herein is exemplified by silicon, ceramics, quartz, semiconductor materials, and magnetic materials.

Next, conditions for the manufacture of a cut article by cutting the workpiece with the resin-coated saw wire will be illustrated.

The workpiece is cut with the coated saw wire while spraying abrasive grains on the saw wire. The abrasive grains are not limited, as long as being generally used in workpiece cutting, and are exemplified by silicon carbide abrasive grains (SiC abrasive grains) and diamond abrasive grains. Among them, diamond abrasive grains are preferably used for the purpose of smoothing the cut surface.

The diamond abrasive grains usable herein are exemplified by SCM FINE DIAMONDS (trade name)" available from Sumiseki Materials Co, Ltd. The diamond abrasive grains may be polycrystalline or single-crystalline, but are preferably single-crystalline. This is because such single-crystalline diamonds are resistant to fracture upon cutting (machining).

The abrasive grains may have an average grain size not critical, but typically from 2 to 15 µm, preferably from 4 to 10 µm, and more preferably from 4 to 7 µm.

The average grain size of the abrasive grains may be measured typically with Microtrac BRA (device name)" available from Nikkiso Co., Ltd.

In general, the abrasive grains are dispersed in a coolant to give a slurry, and the slurry is sprayed on the saw wire. The coolant usable herein is exemplified by water-soluble coolants and oil-based coolants. The water-soluble coolants are exemplified by the ethylene glycol coolant "H4" available from YUSHIRO CHEMICAL INDUSTRY CO., LTD.; and the propylene glycol coolant "HISTAT TMD (trade name)" available from Sanyo Chemical Industries, Ltd. The oil-based coolants are exemplified by "Yushiron Oil (trade name)" available from YUSHIRO CHEMICAL INDUSTRY CO., LTD."

The slurry usable herein may have an abrasive grain concentration of typically from 5 to 50 percent by mass, preferably from 5 to 30 percent by mass, and more preferably from 5 to 10 percent by mass.

The slurry may be used at a temperature of typically hum 10° C. to 30° C., and preferably from 20° C. to 25° C.

The workpiece may be cut with the resin-coated saw wire typically under conditions at a workpiece cutting rate of from 0.1 to 0.35 mm/min and a wire speed of the resin-coated saw wire of 300 m/min or more, preferably 500 m/min or more, and more preferably 800 m/min or more.

A tension (in newton (N)) to be applied to the resin-coated saw wire is preferably set so as to satisfy the condition specified by Expression (1) below. Expression (1) is calculated based on the tensile strength of the base wire (steel wire before being coated with the resin). In Expression (1), the tension is set within a range of from 50% to 70% of the steel wire tensile strength (in newton (N)) because of preventing a break during cutting; and the term "−5.0" is set because a total sum of the cutting load applied to the resin-coated saw wire during cutting and the pull-out load required to pull out the resin-coated saw wire from the workpiece is approximately 5.0 N. Expression (1) is expressed as follows:

$$[\text{Tensile strength}] \times 0.5 - 5.0 \leq [\text{Tension}] \leq [\text{Tensile strength}] \times 0.7 - 5.0 \quad (1)$$

The tensile strength of a steel wire may vary depending on the chemical composition and diameter thereof. Typically, when a piano wire of SWP-A is used as a raw material, steel wires having diameters of 100 µm, 120 µm, and 130 µm have tensile strengths of 24.3 N, 34.4 N, and 39.7 N, respectively. When a piano wire of SWP-B is used as a raw material, steel wires having diameters of 100 µm, 120 µm, and 130 µm have tensile strengths of 26.5 N, 37.7 N, and 45.7 N, respectively. These piano wires are prescribed in JIS G 3522.

A cut article obtained by cutting the workpiece with the resin-coated saw wire has extremely satisfactory surface quality. Specifically, the cut article is advantageously usable typically as materials for solar cells, because the damaged layer depth in the workpiece cut surface is controlled to 5 µm or less (preferably 4 µm or less, and more preferably 3 µm or less).

The damaged layer depth may be measured as the depth of a dislocation etch pit by etching the cut surface, which dislocation is introduced upon workpiece cutting.

The workpiece cut surface may have a surface roughness (arithmetic mean surface roughness Ra) controlled to preferably 0.5 µm or less, more preferably 0.4 µm or less, and furthermore preferably 0.3 µm or less.

The surface roughness may be measured as an arithmetic mean surface roughness (Ra) with "CS-3200 (device name)" available from Mitutoyo Corporation.

The kerf loss for the workpiece may be controlled to preferably from about 1 to about 1.10 times, more preferably from 1 to 1.05 times, furthermore preferably from 1 to 1.04 times, and still more preferably from 1 to 1.03 times the diameter of the resin-coated saw wire. This contributes to better productivity of the cut article.

Specifically, the resin-coated saw wire according to the present invention contributes to a smaller kerf loss. This is because the resin-coated saw wire has a suitably controlled hardness of the resin coating at 120° C., and, even when abrasive grains are sprayed on the resin-coated saw wire, the resin suppresses the introduction of the abrasive grains into between the cut surface and the resin-coated saw wire.

In contrast, when a steel wire as intact is used as the saw wire as in the customary technique 1, the kerf loss is a width corresponding to the diameter of the steel wire added with a length of about 3 times the average diameter of the abrasive grains. The steel wire should have a smaller diameter so as to provide a smaller kerf loss and better productivity. However, there is a limit to increase the steel wire strength in order to prevent a break thereof and, in turn, there is a limit to reduce the steel wire diameter and to reduce the kerf loss.

When loose abrasive grains sprayed during workpiece cutting are to intrude into an abrasive-grain-carrier resin coating as in the customary technique 3, the resulting saw wire has a larger diameter, and this causes a larger kerf loss for the workpiece.

When a workpiece is cut with a fixed-abrasive steel wire as in the customary technique 2, the kerf loss equals to the diameter of the fixed-abrasive steel wire. In this case, the kerf loss may be reduced probably by decreasing the steel wire diameter or decreasing the fixed abrasive grain diameter. However, the steel wire, if having an excessively small diameter, may have insufficient strengths and might fail to endure a cutting load applied during cutting, resulting in a break thereof. In turn, the fixed abrasive grains, if having an excessively small diameter, may become difficult to grind the workpiece and may cause inferior productivity.

In a preferred embodiment, the cut article according to the present invention as obtained from a workpiece has a total thickness variation (TTV) controlled to be 20 μm or less. This level satisfies the specification for regular solar cell wafers (20 μm or less). The TTV is more preferably 15 μm or less, and furthermore preferably 10 μm or less. The TTV is one of evaluation indices for the flatness of the cut article such as a wafer. The TTV is determined by defining the wafer backside as a reference plane; measuring heights of the reference plane in a thickness direction; and defining a difference between the maximum value and the minimum value among the measured heights in the entire wafer as a total thickness variation (TTV). In data given in Table 1 mentioned below, the TTV is calculated by cutting the workpiece with the resin-coated saw wire to give a multiplicity of wafers; sampling successive three wafers corresponding to the center part of the workpiece; measuring the thicknesses of the sampled wafers at thickness measurement points (a total of 15 points) illustrated in FIG. 5 with a wafer-thickness measuring instrument; and calculating the TTV as a difference between the maximum value and the minimum value among the measured thicknesses. The wafer thickness measurement may be performed typically with an electric micrometer available from Tokyo Seimitsu Co., Ltd.

Figure 4B:
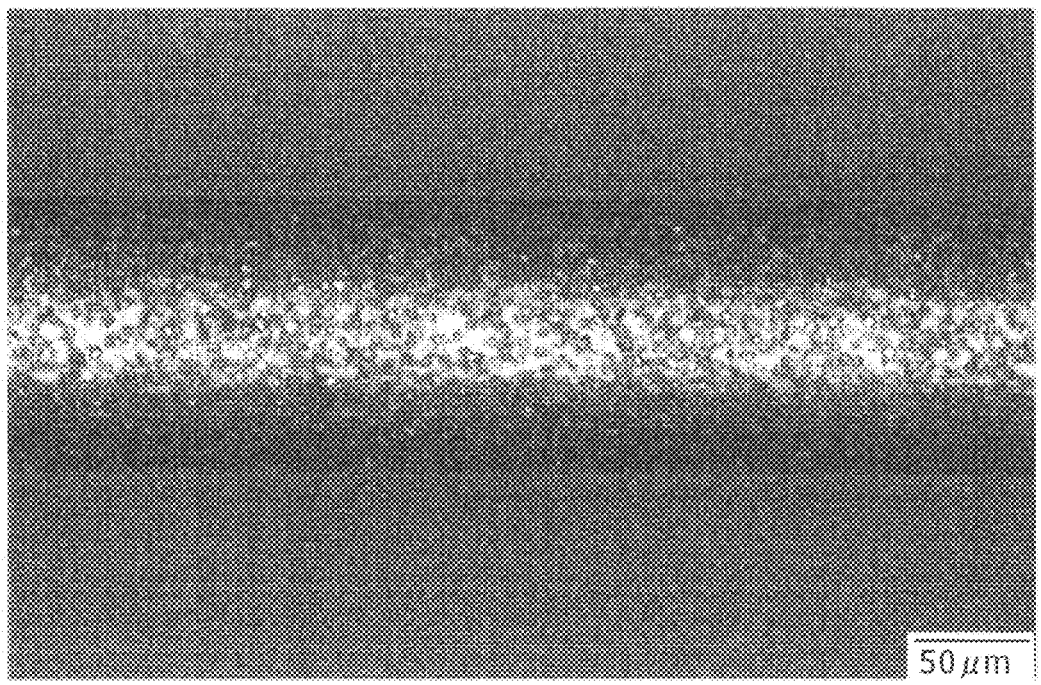
FIG. 4B is a photograph of a surface of the resin-coated saw wire (Comparative Example) after workpiece cutting as in FIG. 4A.
Figures 4C, 5:
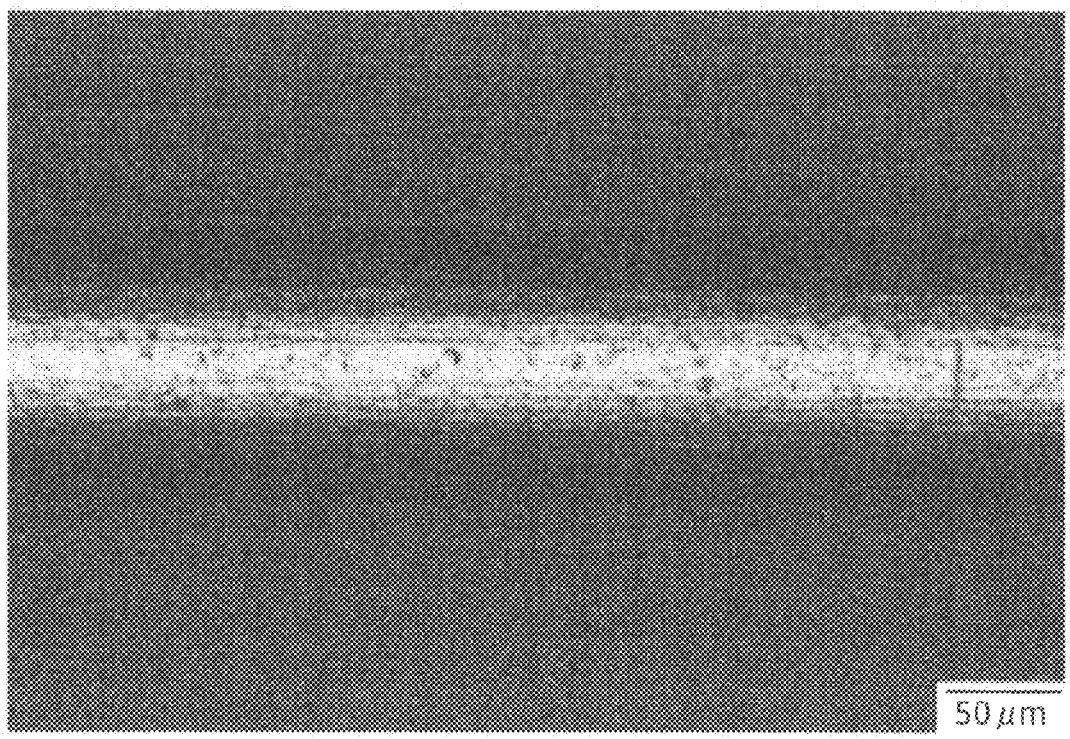
FIG. 4C is a photograph of a surface of the resin-coated saw wire (Example) after workpiece cutting as in FIG. 4A.
FIG. 5 is a diagram illustrating thickness-measurement points to evaluate a total thickness variation (TTV) of a wafer.

Table 1 indicates measurement results of thickness variation (TTV) of wafers cut with the two resin-coated saw wires [Example (Test No. 4) and Comparative Example (Test No. 10)] illustrated in FIGS. 4A, 4B, and 4C, respectively. The sample according to Example had a TTV of 7 μm, which is significantly lower than the specification for regular solar cell wafers (20 μm or less). In contrast, the sample according to Comparative Example had a TTV of 201 μm, indicating a large variation.

The present invention will be illustrated in further detail with reference to several examples (experimental examples) below. It should be noted, however, that the following examples are never intended to limit the scope of the invention; and that various modifications, changes, and alternations not deviating from the spirit and scope of the present invention as described above and below are possible and all fall within the technical scope of the invention.

EXAMPLES

Experimental Example 1

In this experimental example as follows, cut articles were manufactured each by attaching a workpiece (single-crystal silicon) on a working table; training any of saw wires given in Table 1 over the workpiece; allowing the wire to travel; elevating the working table while spraying abrasive grains on the saw wire; and cutting the workpiece with the traveling saw wire. The resulting cut articles were examined on depth of a damaged layer formed in the cut surface, surface roughness (Ra), kerf loss, ratio of the kerf loss to the saw wire diameter, and TTV.

Re: Tests Nos. 1 to 17

Tests Nos. 1 to 17 each employed, as a saw wire, a resin-coated saw wire including a steel wire and, coated on a surface thereof a resin coating given in Table 1 having a thickness given in Table 1. The steel wire was obtained from a piano wire rod which is of SWP-A and which is a wire rod corresponding to "SWRS 82A" as prescribed in JIS G 3502. Specifically, the wire rod contained C in a content of 0.82 percent by mass, Si in a content of 0.19 percent by mass, and Mn in a content of 0.49 percent by mass with the remainder consisting of iron and inevitable impurities. As the steel wire, Tests Nos. 1 to 4, 6, 7, and 9 to 13 employed a steel wire prepared by drawing the wire rod to a diameter (indicated as "base wire diameter" in Table 1) of 130 μm; Test No. 5 employed a steel wire prepared by drawing to a diameter of 110 μm; Tests Nos. 8, 14, 16, and 17 employed a steel wire prepared by drawing to a diameter of 120 μm; and Test No. 15 employed a steel wire prepared by drawing to a diameter of 100 μm.

Specifically, the resin coating was formed by applying a varnish as follows to the steel wire surface; and heating the applied varnish at a heating temperature given in Table 1 to cure the varnish (resin). More specifically, the resin coating was formed on the steel wire surface by subjecting the steel wire to degreasing prior to the resin coating formation; coating the steel wire surface with the varnish in number of coating procedures of from 4 to 10 so as to give a thickness (thickness as the resin-coated saw wire) given in Table 1; and heating the coated film to cure the varnish (resin). Table 1 also gives the diameter (wire outer diameter) of the saw wire after resin coating. None of the resin coatings contained abrasive grains.

Tests Nos. 1 to 10 employed a varnish for polyurethane-coated wires "W143" as prescribed in JIS C 2351 (varnish for enameled wires "TPU F1 (trade name)" supplied by TOTOKU TORYO CO., LTD., the varnish gives a polyurethane coating after baking).

Tests Nos. 11, 12, and 15 to 17 employed a varnish for polyamide-imide-coated wires (varnish for enameled wires "Neoheat AI-00C (trade name)" supplied by TOTOKU TORYO CO., LTD., the varnish gives a polyamide-imide coating after baking).

Tests Nos. 13 and 14 employed a polyimide varnish (polyimide varnish "U-varnish (trade name)" supplied by Ube Industries, Ltd., the coating after baking had a chemical composition of a polyimide).

The resin-coated saw wires were examined on resin hardness through measurement by the nanoindentation technique. The hardness was measured at room temperature (23° C.) or at 120° C. Specific measurement conditions are as follows:

Common Measurement Conditions Both at Room Temperature and at 120° C.
Measurement Equipment: "Nano Indenter XP/DCM" supplied by Agilent Technologies
Analysis Software: "Test Works 4" supplied by Agilent Technologies
Tip: XP
Strain Rate: 0.05/second
Measurement Point Interval: 30 µm
Reference Standard: fused silica
Measurement Conditions at Room Temperature
Measurement Mode: CSM (continuous stiffness measurement)
Excited Vibration Frequency: 45 Hz
Excited Vibration Amplitude: 2 nm
Indentation Depth: to 500 nm
Measurement Points: 15 points
Measurement Environment: at an ambient temperature of 23° C. in an air conditioner The hardness measurement at room temperature was performed by a continuous stiffness measurement technique, and the hardness was measured in a region of an indentation depth from the resin coating outermost surface of from 400 to 450 nm. The hardness measurement was performed at 15 points, and the measured results were averaged to calculate the hardness. In the hardness measurement, outlier (abnormal value) exception as follows was to be basically performed. However, such outlier was not observed in this experimental example.

Specifically, a value which is 3 times or more greater than, or one-third or less smaller than the average is defined as an "outlier". Such outlier, if included in measured data, is excluded, and a datum newly measured is added to the measured data so as to measure the hardness at a total of 15 measurement points.

Measurement Conditions at 120° C.
Measurement Mode: Basic (unloading measurement technique)
Indentation Depth: to 450 µm
Measurement Points: 10 points
Measurement Environment: the sample tray is held at 120° C. using an electrical resistance heater The hardness measurement at 120° C. was performed by an unloading measurement technique, and the hardness was measured at a position corresponding to an indentation depth from the resin coating outermost surface of 450 nm. Specifically, the hardness measurement with sample heating cannot employ the continuous stiffness measurement technique as in the hardness measurement at room temperature. Thus, the hardness measurement was performed by adjusting the load so that a measurement position be a position at an indentation depth film the outermost surface of 450 nm.

The resin-coated saw wire was bonded to a metallic nanoindentation sample tray with a ceramic adhesive, and the hardness measurement at 120° C. was performed while heating and holding the sample tray at 120° C. using an electrical resistance heater.

The hardness measurement at 120° C. was performed at 10 points, and measured data were averaged to calculate the hardness. In the hardness measurement, outlier exception as follows was to be basically performed. However, such outlier was not observed in this experimental example.

Specifically, a value which is 3 times or more greater than, or one-third or less smaller than the average is defined as an "outlier". Such outlier, if included in measured data, is excluded, and a datum newly measured is added to the measured data so as to measure the hardness at a total of 10 measurement points.

Re: Tests Nos. 18 to 20

These were comparative examples not undergoing resin coating and employed steel wires obtained from the same piano wire rod as in Tests Nos. 1 to 17, which had been drawn to a diameter of 120 µm (Test No. 18) or 160 µm (Tests Nos. 19 and 20).

Re: Test No. 21

This sample is an example of customary fixed-abrasive wire bearing abrasive grains fixed thereto. The fixed-abrasive wire used herein was prepared by drawing the same piano wire rod as in Tests Nos. 1 to 17 to a diameter of 120 µm to give a steel wire, subjecting the steel wire to Ni plating on a surface thereof to form a Ni plating layer, and fixing diamond abrasive grains having a maximum diameter of 17.5 µm to the Ni plating layer. The fixed-abrasive wire had a diameter of 155 µm.

Next, a single-crystal silicon (60 mm by 20 mm by 50 mm) was cut (sliced) using a multi-wire saw ("D-500" supplied by YASUNAGA CORPORATION) with any of the saw wires of Tests Nos. 1 to 21. In Tests Nos. 1 to 20, the slicing was performed while spraying any of slurries on between the saw wire and the single-crystal silicon. The slurries were prepared by suspending SIC abrasive grains ("SHINANO-RUNDUM (trade name)" supplied by Shinano Electric Refining Co., Ltd.) or diamond abrasive grains ("SCM FINE DIAMONDS (trade name)" supplied by Sumiseki Materials Co., Ltd.) in a coolant ("Water Solute Ethylene Glycol" supplied by YUSHIRO CHEMICAL INDUSTRY CO., LTD.). The abrasive grains each had an average grain size given in Table 1. In Test No. 21, the slicing was performed while spraying a coolant alone on between the saw wire and the single-crystal silicon. The coolant was an aqueous ethylene glycol solution not containing abrasive grains.

The slurries had a concentration of SiC abrasive grains of 50 percent by mass or a concentration of diamond abrasive grains of 5 percent by mass. The slurries were fed at a temperature of from 20° C. to 25° C. and at a flow rate of 100 L/min.

The working table supporting the workpiece was elevated during slicing at different rates (at different cutting rates) in the range of from 0.1 to 0.3 mm/min as given in Table 1. Other slicing conditions were set so that the resin-coated saw wire traveled at a wire speed of 500 m/min with a tension of 25 N; whereas the resin-coated saw wire was wound in a number of wire turns of 41 at a winding pitch of 1 mm.

Calculation of Ratio of Kerf Loss to Saw Wire Diameter

Slicing was performed with any of the saw wires of Tests Nos. 1 to 21 under the conditions, and the kerf loss was measured. On Tests Nos. 1 to 20, the difference (cutting loss) between the kerf loss and the saw wire diameter, and the ratio of the kerf loss to the saw wire diameter were calculated. In this experimental example, a sample having a kerf loss ratio as calculated above of from 1 to 1.10 times was evaluated as accepted.

Observation of Resin-coated Saw Wire Surface

Surfaces of the resin-coated saw wires of Tests Nos. 1 to 8 and 11 to 17 were visually observed to find that the surfaces suffered from little intrusion of the abrasive grains. In contrast, the resin-coated saw wires used in Tests Nos. 9 and 10 suffered from intrusion of the abrasive grains on their surfaces. For reference, FIGS. 4B and 4C depict photographs of surfaces of the resin-coated saw wires of Test No. 4 (Example) and Test No. 10 (Comparative Example).

Measurement of Number of Abrasive Grains Intruded into Resin Surface

Figure 6:
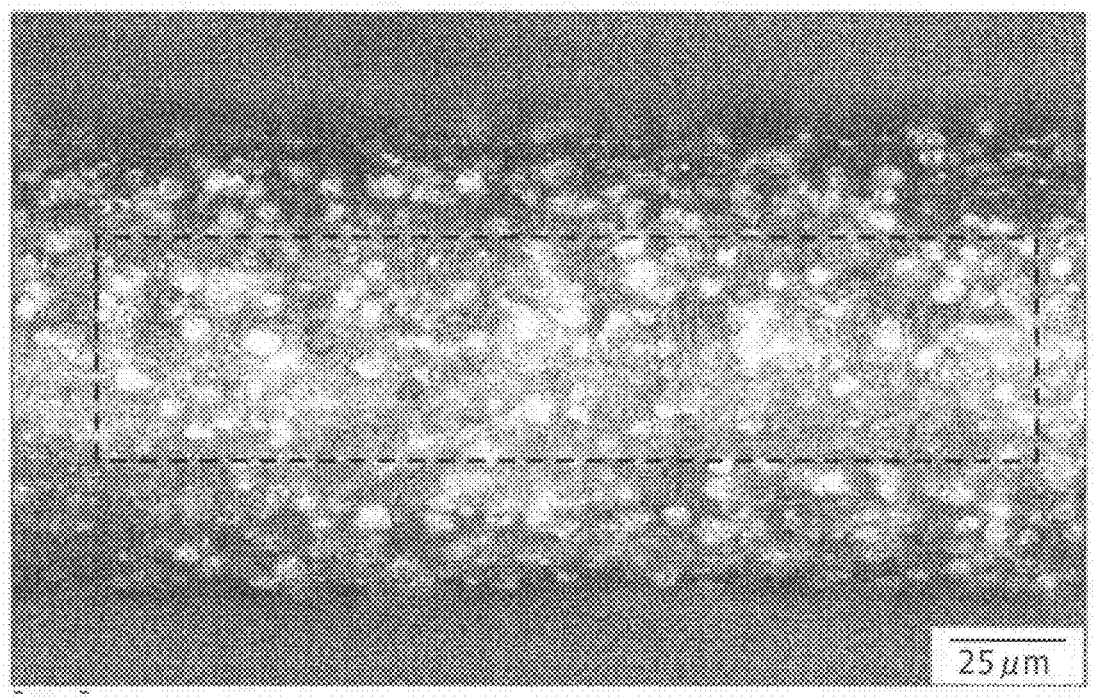
FIG. 6 depicts a measurement area to measure the number of abrasive grains intruded into the resin.

The resin-coated saw wires used in Tests Nos. 1 to 17 were subjected to measurement of the number of abrasive grains intruded into the resin surface. Specifically, the surface of each resin-coated saw wire after slicing was photographed with an optical microscope at 400-fold magnification, and the number of abrasive grains observed in an area of 50 µm by 200 µm in the vicinity of the center of the resin-coated saw wire was visually counted. The measurement area is indicated by dotted lines in FIG. 6.

Measurements of Damaged Layer Depth and Cut Surface Roughness

Workpieces were sliced with the saw wires of Tests Nos. 1 to 21 to give cut articles. On the cut articles, the depth of a damaged layer formed in the cut surface and the roughness of the cut surface were measured.

Damaged Layer Depth

Figure 7:
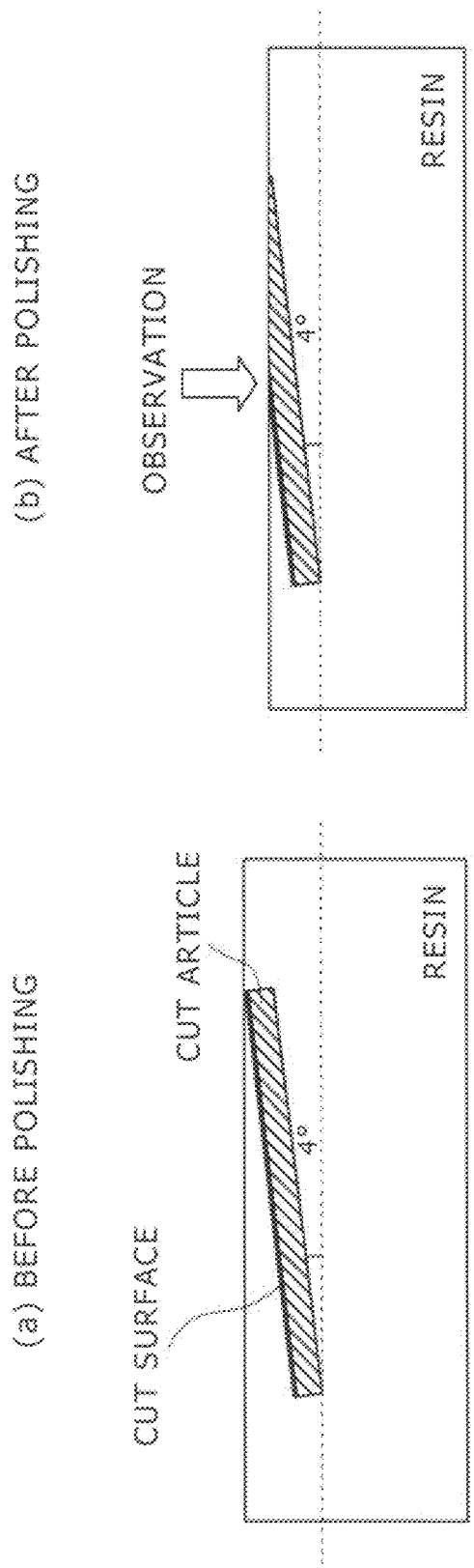
FIGS. 7(a) and 7(b) are cross-sectional views illustrating how to measure the depth of a damaged layer.
Figure 8:
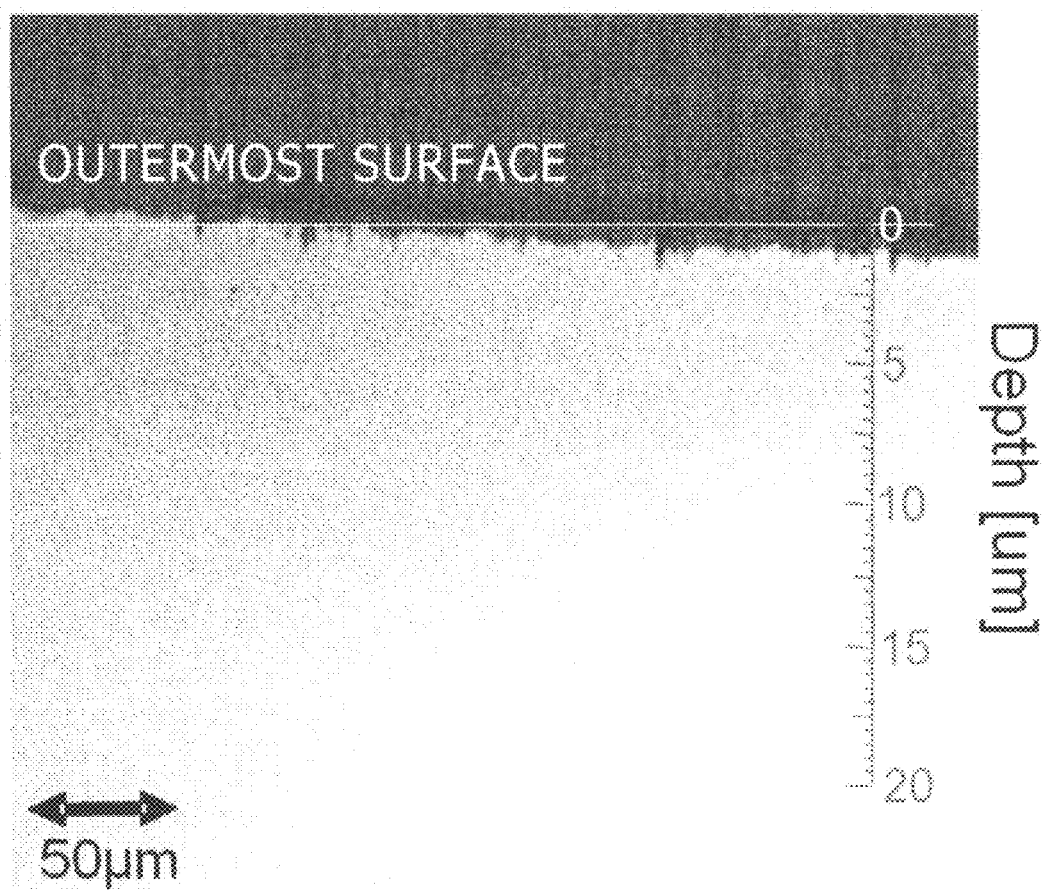
FIG. 8 is a photograph of a cut surface of a workpiece taken with an optical microscope.
Figure 9:
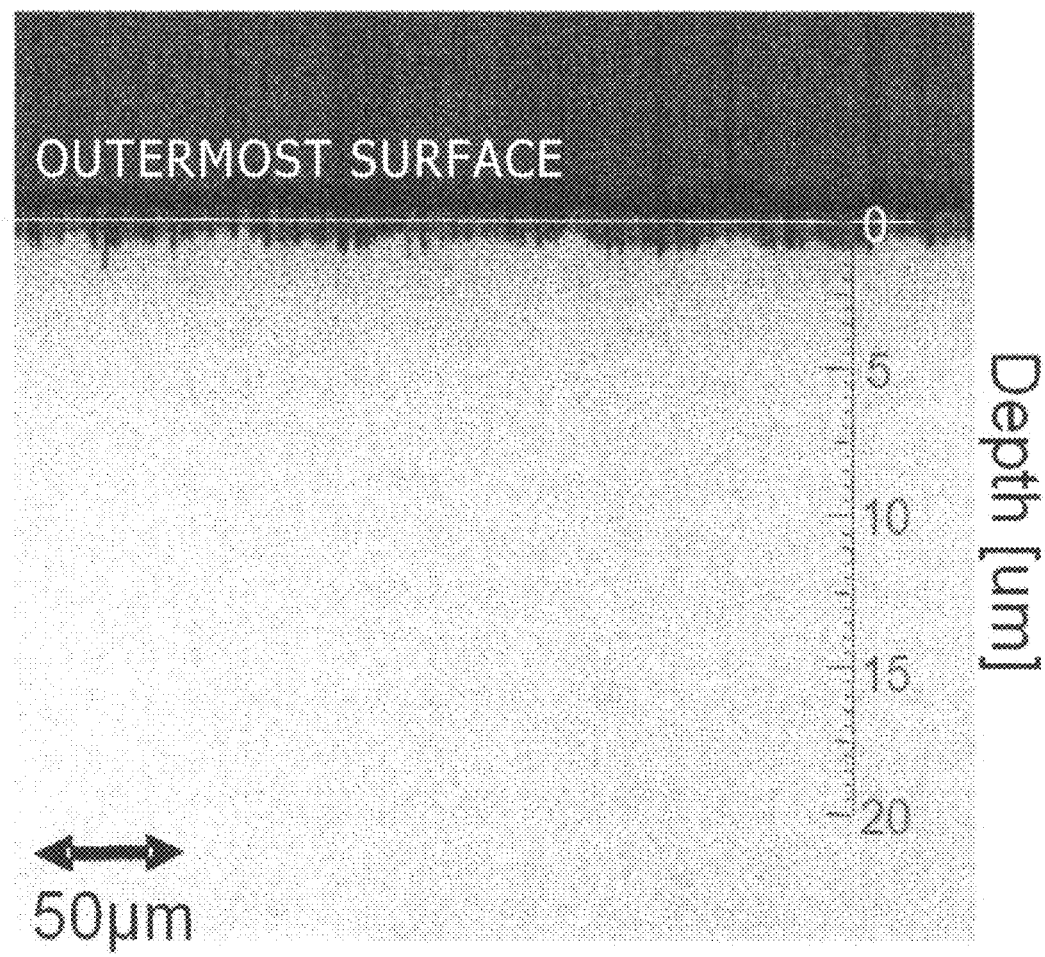
FIG. 9 is a photograph of a cut surface of a workpiece taken with an optical microscope.
Figure 10:
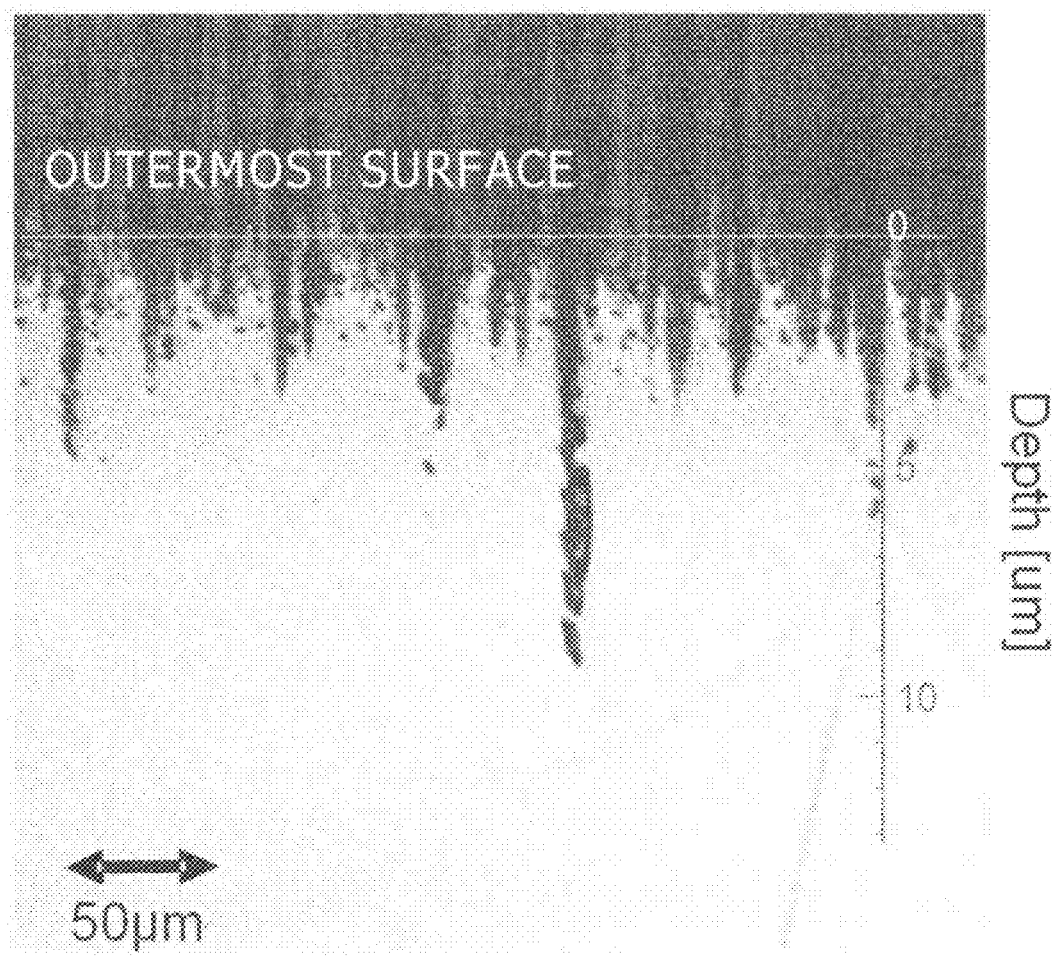
FIG. 10 is a photograph of a cut surface of a workpiece taken with an optical microscope.
Figure 11:
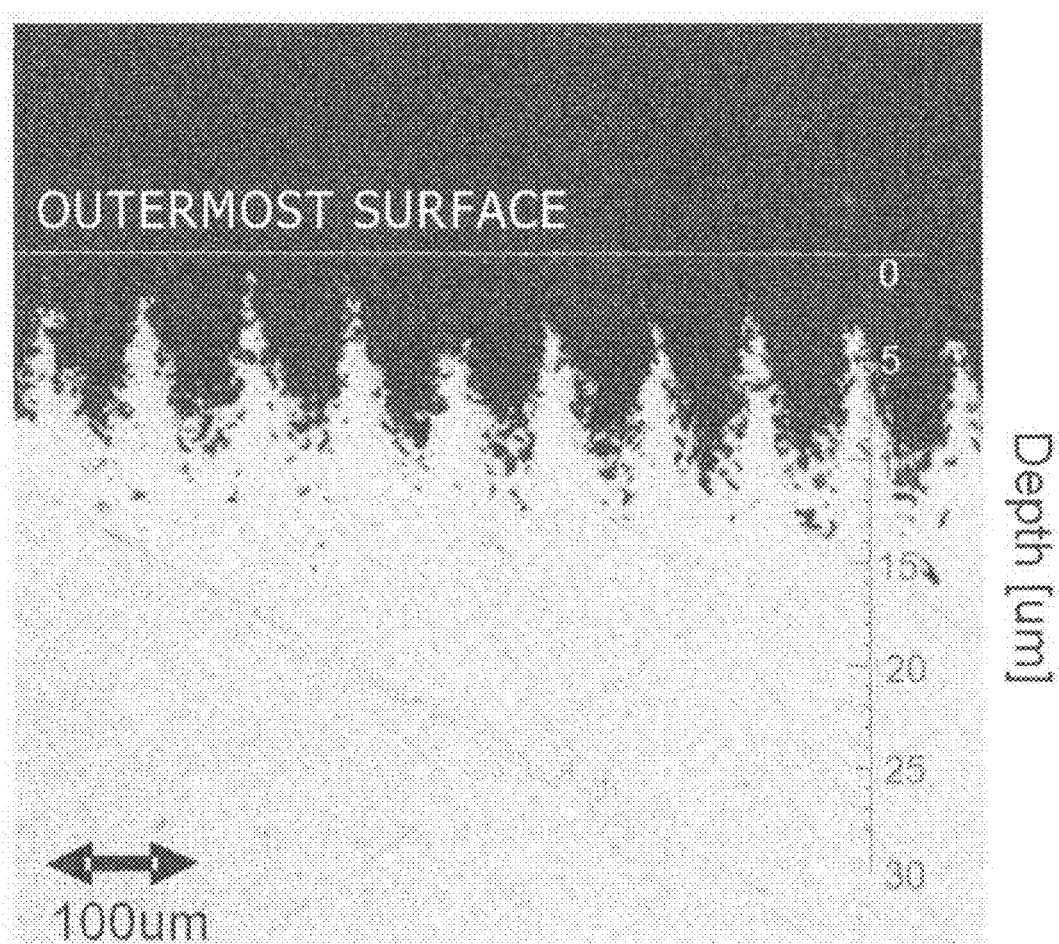
FIG. 11 is a photograph of a cut surface of a workpiece taken with an optical microscope.
Figure 12:
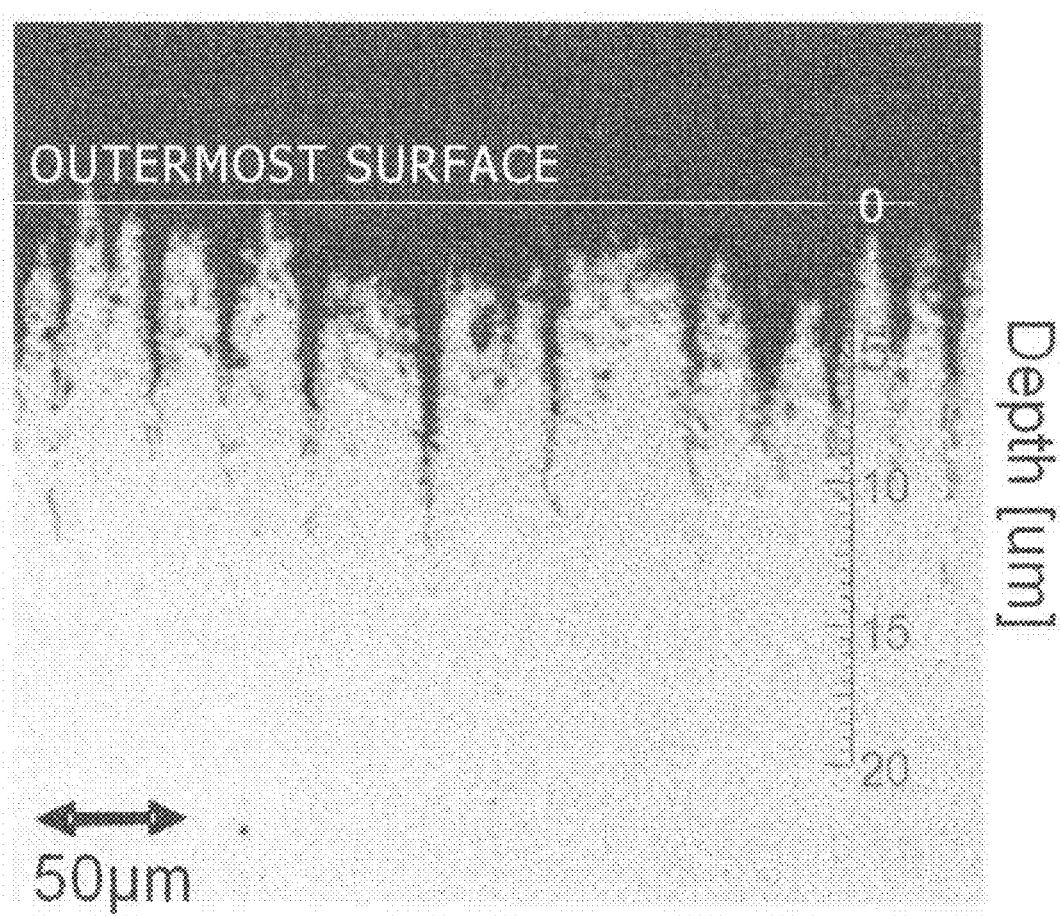
FIG. 12 is a photograph of a cut surface of a workpiece taken with an optical microscope.
Figure 13:
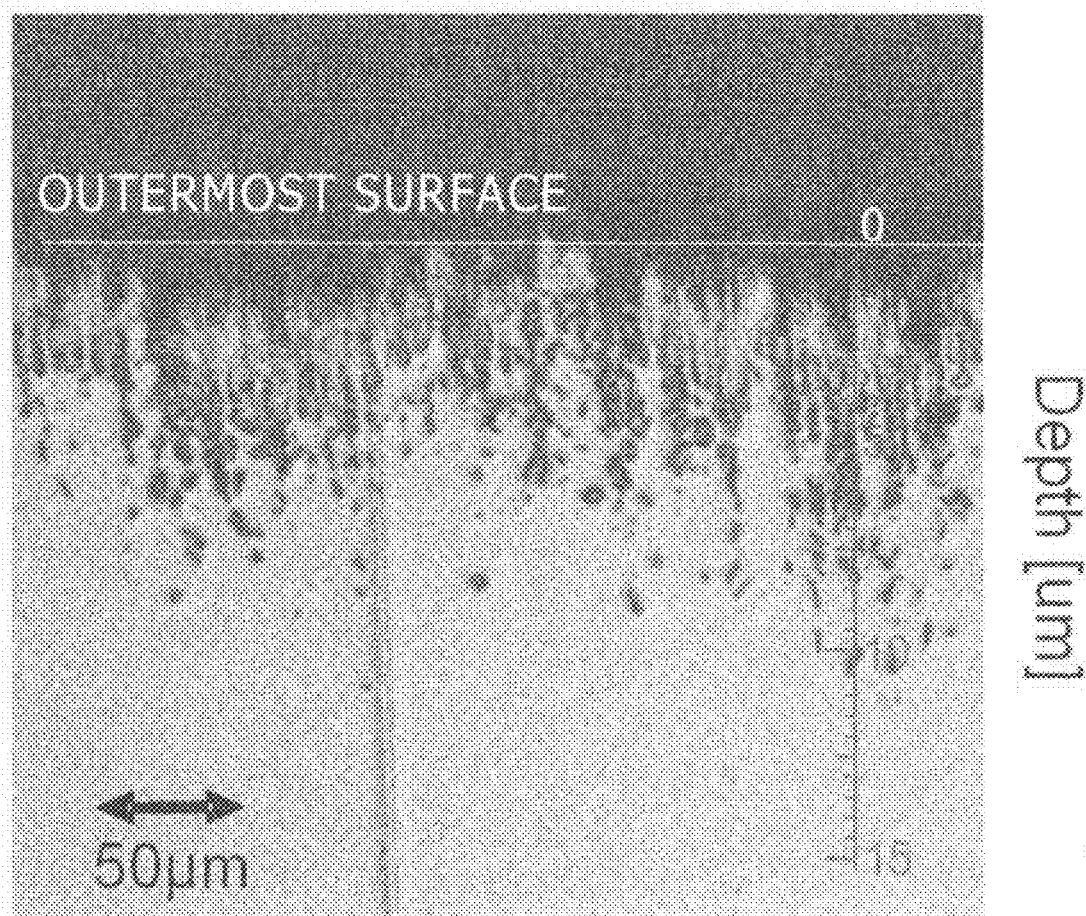
FIG. 13 is a photograph of a cut surface of a workpiece taken with an optical microscope.

The depth of a damaged layer formed in the cut surface was measured in a manner as follows. Each cut article was embedded in a resin so as to be at an inclination of 4 degrees from the horizontal as illustrated in FIG. 7(a). The cut article and the resin were polished so that the cut surface of the cut article was exposed as illustrated in FIG. 7(b). Next, the exposed surface was etched with an etchant having a chemical composition given in Table 2, and the damaged layer formed during workpiece cutting (etch pit of dislocation introduced during workpiece cutting) was observed with an optical microscope. In this experimental example, a sample having a damaged layer depth of 5 µm or less was evaluated as accepted.

FIGS. 8 to 13 depict photographs of cut surfaces of workpieces taken with an optical microscope. FIGS. 8, 9, 10, 11, 12, and 13 depict the photographs of Tests Nos. 4, 6, 10, 18, 20, and 21, respectively.

The damaged layer appeared black in optical microscope observation, and the depth (thickness) thereof was measured.

Surface Roughness

The surface roughness of the cut surface was measured as an arithmetic mean surface roughness Ra over a 10-mm line in the cutting direction (cutting depth direction) using "CS-3200 (device name)" supplied by Mitutoyo Corporation. In this experimental example, a sample having an Ra of 0.5 µm or less was evaluated as having satisfactory smoothness (accepted).

Total Thickness Variation TTV

The TTV was measured on Tests Nos. 1 to 21 by the aforementioned procedure. In this experimental example, a sample having a TTV of 20 µm or less was evaluated as accepted.

The results are collectively indicated in Table 1.

TABLE 1

| | Saw wire | | | | | Resin coating hardness | | | Abrasive grains | |
| | Base wire | | Resin coating | | | Heating | Room | | | Average |
| No. | Type | diameter (µm) | Material | Thickness (µm) | Diameter (µm) | temperature (° C.) | temperature (GPa) | 120° C. (GPa) | Material | grain size (µm) |
| --- | --- | --- | --- | --- | --- | --- | --- | --- | --- | --- |
| 1 | Coated saw wire | 130 | Polyurethane | 11 | 152 | 250 | 0.27 | 0.18 | Diamond | 5.6 |
| 2 | Coated saw wire | 130 | Polyurethane | 8 | 146 | 250 | 0.27 | 0.14 | Diamond | 5.6 |
| 3 | Coated saw wire | 130 | Polyurethane | 7 | 144 | 250 | 0.27 | 0.16 | Diamond | 5.6 |
| 4 | Coated saw wire | 130 | Polyurethane | 6.5 | 143 | 250 | 0.28 | 0.16 | Diamond | 5.6 |
| 5 | Coated saw wire | 110 | Polyurethane | 6 | 122 | 250 | 0.27 | 0.15 | Diamond | 5.6 |
| 6 | Coated saw wire | 130 | Polyurethane | 6 | 142 | 250 | 0.27 | 0.15 | Diamond | 5.6 |
| 7 | Coated saw wire | 130 | Polyurethane | 3 | 136 | 250 | 0.29 | 0.10 | Diamond | 5.6 |
| 8 | Coated saw wire | 120 | Polyurethane | 5.5 | 131 | 250 | 0.27 | 0.15 | Diamond | 5.6 |
| 9 | Coated saw wire | 130 | Polyurethane | 5.5 | 141 | 200 | 0.26 | 0.06 | Diamond | 5.6 |
| 10 | Coated saw wire | 130 | Polyurethane | 5.5 | 141 | 150 | 0.26 | 0.04 | Diamond | 5.6 |
| 11 | Coated saw wire | 130 | Polyamide-imide | 6 | 142 | 300 | 0.30 | 0.28 | Diamond | 5.6 |
| 12 | Coated saw wire | 130 | Polyamide-imide | 6 | 142 | 350 | 0.33 | 0.30 | Diamond | 5.6 |
| 13 | Coated saw wire | 130 | Polyimide | 5 | 140 | 300 | 0.33 | 0.27 | Diamond | 5.6 |
| 14 | Coated saw wire | 120 | Polyimide | 5 | 130 | 300 | 0.31 | 0.31 | Diamond | 5.6 |
| 15 | Coated saw wire | 100 | Polyamide-imide | 5 | 110 | 300 | 0.33 | 0.28 | Diamond | 5.6 |
| 16 | Coated saw wire | 120 | Polyamide-imide | 4.5 | 129 | 300 | 0.30 | 0.30 | Diamond | 5.6 |
| 17 | Coated saw wire | 120 | Polyamide-imide | 5 | 130 | 300 | 0.30 | 0.29 | Diamond | 5.6 |
| 18 | Steel wire | 120 | — | — | 120 | — | — | — | SiC | 13 |
| 19 | Steel wire | 160 | — | — | 160 | — | — | — | Diamond | 5.6 |
| 20 | Steel wire | 160 | — | — | 160 | — | — | — | Diamond | 5.6 |
| 21 | Fixed-abrasive wire | 120 | — | — | 155 | — | — | — | (Diamond) | (17.5) |

TABLE 1-continued

| No. | Working table elevating rate (mm/min) | Number of intruded abrasive grains | Damaged layer (μm) | Arithmetic mean roughness Ra (μm) | Kerf loss (μm) | Cutting loss in width (μm) | Ratio of cut margin to saw wire diameter | Wafer total thickness variation TTV (μm) |
|---|---|---|---|---|---|---|---|---|
| 1 | 0.3 | 2 | 2 | 0.416 | 160 | 8 | 1.05 | 15 |
| 2 | 0.3 | 1 | 1.5 | 0.361 | 153 | 7 | 1.05 | 6 |
| 3 | 0.1 | 4 | 3.5 | 0.355 | 147 | 3 | 1.02 | 10 |
| 4 | 0.1 | 0 | 1 | 0.217 | 149 | 6 | 1.04 | 7 |
| 5 | 0.1 | 3 | 2 | 0.332 | 125 | 3 | 1.02 | 10 |
| 6 | 0.3 | 3 | 2 | 0.324 | 144 | 2 | 1.01 | 11 |
| 7 | 0.3 | 5 | 4 | 0.412 | 141 | 5 | 1.04 | 13 |
| 8 | 0.1 | 2 | 3 | 0.214 | 135 | 4 | 1.03 | 9 |
| 9 | 0.1 | 30 | 8 | 0.297 | 161 | 20 | 1.14 | 59 |
| 10 | 0.1 | 61 | 9.5 | 0.366 | 182 | 41 | 1.29 | 201 |
| 11 | 0.3 | 3 | 3.5 | 0.364 | 147 | 5 | 1.04 | 18 |
| 12 | 0.1 | 0 | 1 | 0.289 | 151 | 9 | 1.06 | 10 |
| 13 | 0.1 | 0 | 1 | 0.260 | 152 | 10 | 1.09 | 10 |
| 14 | 0.1 | 0 | 1.5 | 0.355 | 135 | 5 | 1.04 | 10 |
| 15 | 0.1 | 2 | 2 | 0.314 | 115 | 5 | 1.05 | 18 |
| 16 | 0.1 | 0 | 1.5 | 0.388 | 129 | 0 | 1.00 | 16 |
| 17 | 0.1 | 1 | 2 | 0.396 | 133 | 3 | 1.02 | 7 |
| 18 | 0.3 | — | 15 | 0.610 | 160 | 40 | 1.33 | 8 |
| 19 | 0.3 | — | 10 | 0.958 | 177 | 17 | 1.11 | 12 |
| 20 | 0.1 | — | 15.5 | 0.794 | 177 | 17 | 1.11 | 11 |
| 21 | 0.3 | — | 10 | 0.650 | 155 | — | — | 15 |

TABLE 2

| Ingredient | Amount |
|---|---|
| Hydrofluoric acid (HF) | 60 ml |
| Nitric acid ($HNO_3$) | 30 ml |
| Acetic acid ($CH_3COOH$) | 60 ml |
| Aqueous chromic acid solution ($CrO_3$) | 30 ml |
| Copper nitrate ($CuNO_3$) | 2 g |
| Pure water ($H_2O$) | 60 ml |

Table 1 speculates as follows. Tests Nos. 1 to 8 and 11 to 17 were examples in which cut articles were manufactured with the resin-coated saw wires satisfying conditions specified in the present invention. The samples (cut articles) each had a shallow depth of a damaged layer of 5 μm or less as formed in the cut surface and had an approximately smooth cut surface having an arithmetic mean surface roughness Ra of 0.5 μm or less. The samples also exhibited a kerf loss ratio controlled within a range of from 1 to 1.10 times, indicating that the saw wires contributed to better productivity. In addition, the samples each had a very small variation TTV of 20 μm or less. Visual observation on surface of the resin-coated saw wires after slicing revealed that few grains were attached to the surfaces.

Specifically, cut articles having an arithmetic mean surface roughness Ra controlled to be 0.5 μm or less, when used as materials typically for solar cells, contribute to better production efficiency such that they can be subjected as intact (without a further treatment) to etching to form fine textures on the surface.

In contrast, samples not satisfying at least one of the conditions specified in the present invention had disadvantages as follows.

Tests Nos. 9 and 10 were samples using resin-coated saw wires coated with a polyurethane resin coating. In the resin-coated saw wires, the resin coatings had a hardness at 120° C. not satisfying the condition specified in the present invention and were excessively soft. These samples thereby suffered from intrusion of the abrasive grains in the resin upon slicing. In addition, the samples had a deep damaged layer formed on the cut surface with a depth of more than 5 μm and had a high TTV of extremely higher than the target level of 20 μm or less. These data demonstrate that intrusion of the abrasive grains into the resin surface significantly adversely affected the damaged layer depth and TTV; and that, to prevent this, the suppression of the intrusion of the abrasive grains into the resin surface is important, namely, the control of the resin hardness at 120° C. to 0.07 MPa or more is important.

Tests Nos. 18 to 20 employed, as saw wires, steel wires not coated with a resin coating, thereby suffered from the formation of a deep damaged layer in the cut surface and suffered from a rough cut surface with a surface roughness (Ra) greater than the acceptance criterion of 0.5 μm or less. Cut articles, if having an arithmetic mean surface roughness Ra of greater than 0.5 μm as in these samples, exhibit inferior productivity such that they require etching for smoothing the cut surface prior to etching for forming fine textures.

In addition, Tests Nos. 18 to 20 each had a kerf loss ratio of greater than the acceptance criterion of 1.10 times. Among them, Test No. 18 had an extremely large kerf loss ratio of 1.33 times far greater than the acceptance criterion of 1.10 times. Specifically, the loose abrasive grains were introduced into between the steel wire and the workpiece during workpiece cutting to cut away the workpiece excessively. As a result, the kerf loss for the workpiece and the cutting loss increased to 160 μm and 40 μm, respectively, resulting in inferior productivity. To reduce the kerf loss, the steel wire may probably have a smaller diameter. However, the steel wire, if having an excessively small diameter, may readily break, because the steel wire itself is also cut away during workpiece cutting. To prevent such a break, a steel wire, if having a diameter of 120 μm as in Test No. 18, should be replaced before the steel wire has a diameter reduced down to 100 μm. This technique, however, significantly adversely affects the productivity and is not practical.

Test No. 21 employed a fixed-abrasive wire as a saw wire, thereby suffered from a deep damaged layer formed in the cut surface and suffered from a rough cut surface with a high surface roughness (Ra). Test No. 21 was obtained by cutting a workpiece without spraying loose abrasive grains and thereby had a kerf loss for the workpiece of 155 μm, equal to the fixed-abrasive wire diameter.

Figure 14:
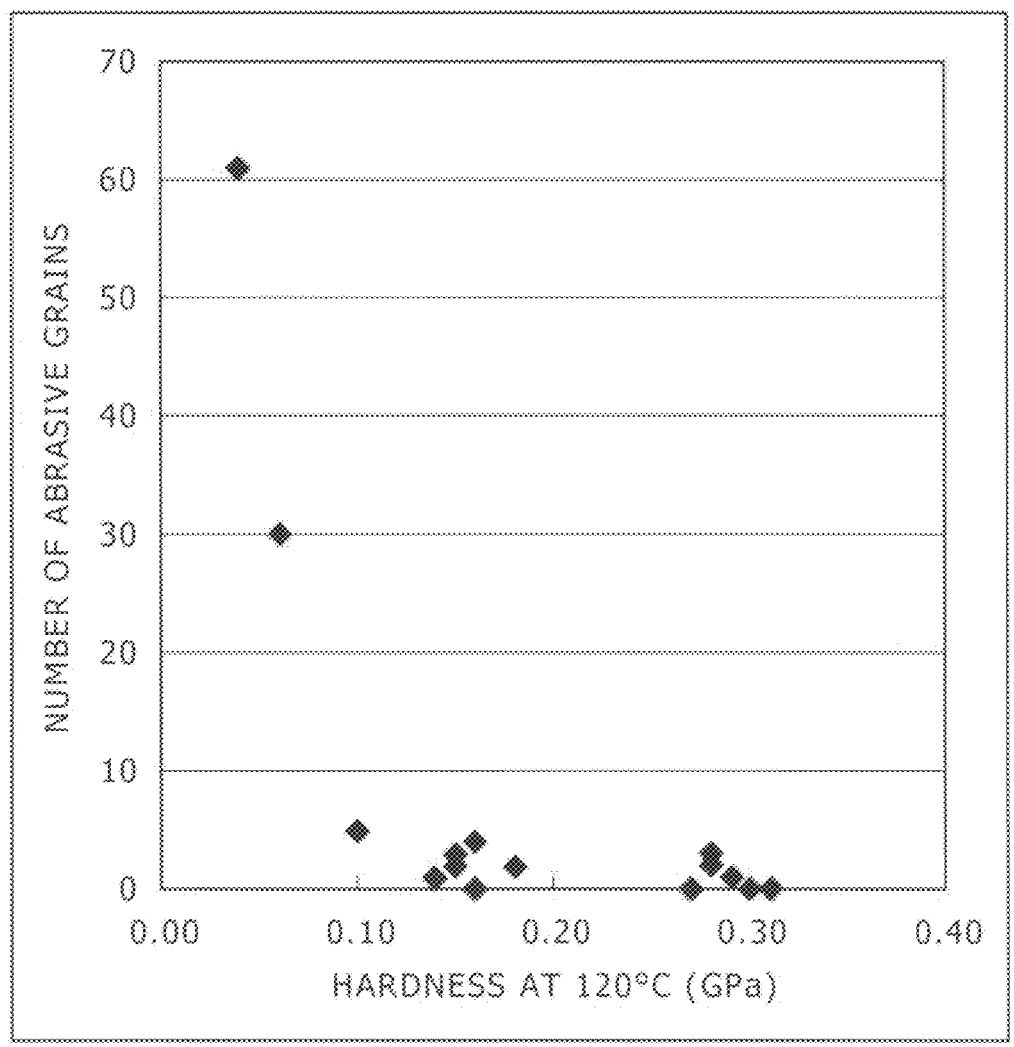
FIG. 14 is a graph illustrating how the number of abrasive grains intruded into the resin coating surface varies depending on the hardness of a resin coating measured at 120° C.

FIG. 14 illustrates how the number of abrasive grains intruded into the resin coating surface varies depending on the resin coating hardness at 120° C. The plotting is made based on the data obtained in Tests Nos. 1 to 17 in Table 1. The number of abrasive grains is a number in an observation field of view of 50 μm by 200 μm. These samples had approximately identical resin coating hardness of around 0.3 GPa when measured at room temperature, but had significantly different resin coating hardness ranging from 0.04 to 0.30 GPa when measured at 120° C. Even when using the same resin and the same varnish, resin coatings may have different thicknesses by performing coating to the steel wire under different conditions (e.g., number of coating procedures), as in Tests Nos. 1 and 7. Specifically, Test No. 1 had a resin coating thickness of 11 μm; whereas Test No. 7 had a resin coating thickness of 3 μm. The resin coatings thereby have different hardness at 120° C. In addition, resin coatings, when using different types of resin and/or when formed at different heating temperatures, may probably have different hardness at 120° C.

FIG. 14 indicates that the number of abrasive grains intruded into the resin coating tends to increase with an increasing resin coating hardness at 120° C.; and that the number of intruded abrasive grains can be significantly reduced to 5 or less by regulating the resin coating hardness at 120° C. to 0.07 GPa or more.

Figure 15:
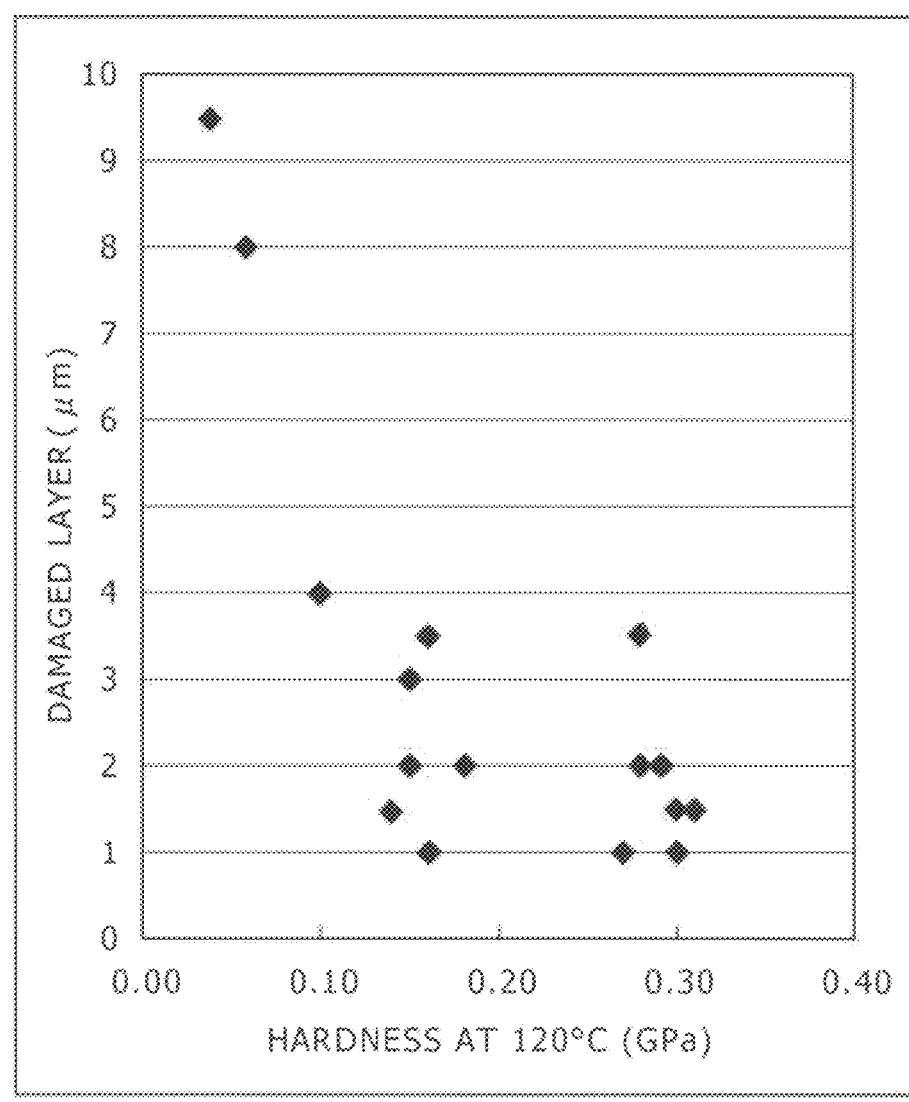
FIG. 15 is a graph illustrating how the depth of a damaged layer formed in the cut surface varies depending on the hardness of a resin coating measured at 120° C.

FIG. 15 illustrates how the depth of a damaged layer formed in the cut surface varies depending on the resin coating hardness at 120° C., as plotted based on the data of Tests Nos. 1 to 17 given in Table 1. FIG. 15 indicates that the damaged layer depth tends to decrease with an increasing resin coating hardness at 120° C.; and that the damaged layer depth can be controlled to 5 μm or less by regulating the resin coating hardness at 120° C. to 0.07 GPa or more.

Figure 16:
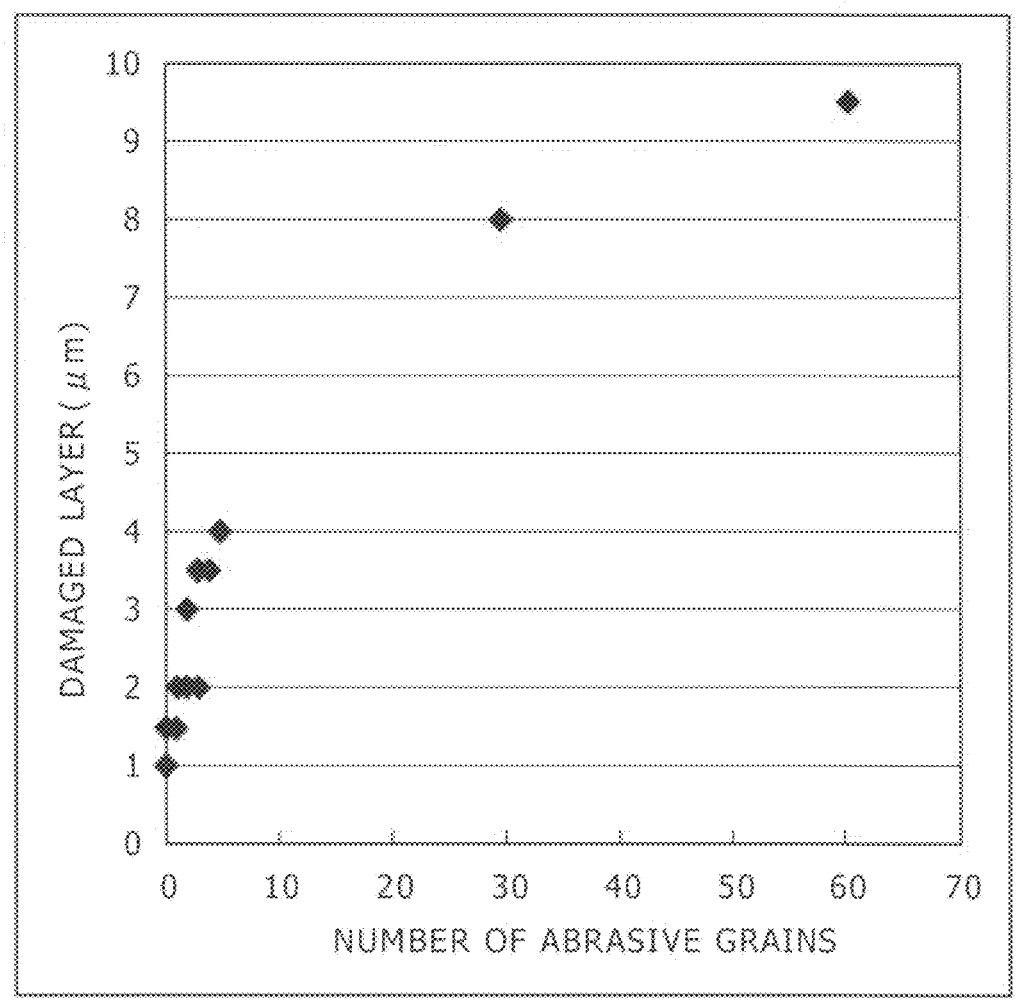
FIG. 16 is a graph illustrating how the depth of a damaged layer formed in the cut surface varies depending on the number of abrasive grains intruded into the resin coating.

FIG. 16 illustrates how the depth of a damaged layer formed in the cut surface varies depending on the number of abrasive grains intruded into the resin coating, as plotted based on the data of Tests Nos. 1 to 17 given in Table 1. FIG. 16 indicates that the damaged layer tends to be formed in a shallower depth with a decreasing number of abrasive grains intruded into the resin coating; and that the damaged layer depth can be controlled to 5 μm or less by controlling the number of abrasive grains intruded into the resin coating to 10 or less. FIG. 14 indicates that the number of abrasive grains intruded into the resin coating can be controlled to 10 or less by regulating the resin coating hardness at 120° C. to 0.07 MPa or more.

FIGS. 14 to 16 indicate that the damaged layer depth tends to decrease with a decreasing number of abrasive grains intruded into the resin coating surface. The intrusion of abrasive grains into the resin surface significantly adversely affect the damaged layer depth and TTV. In view of this, the experimental data given in Table 1 indicate that the condition as specified in the present invention (the control of the resin coating hardness at 120° C. to 0.07 GPa or more) is a very important condition to impart satisfactory properties to cut articles.

In addition, Test No. 8 (resin-coated wire according to Example), Test No. 18 (steel wire without resin coating), and Test No. 21 (fixed-abrasive wire) will be discussed. These samples each employed, as a base wire, a steel wire prepared by drawing the piano wire rod to a diameter of 120 μm, thereby had an identical tensile strength, and probably had the same risk against a break. However, the data demonstrate that Test No. 8 (Example) had a smallest kerf loss and best productivity.

Assume that currently-mainstream 0.18-mm thick wafers are cut out from a 300-mm long single-crystal silicon using a saw wire. In this case, results as follows will be obtained as calculated based on the data obtained in Experimental Example 1. Specifically, the steel wire of Test No. 18, when used as the saw wire, gives a total of 882 wafers because of having a kerf loss of 160 μm. The fixed-abrasive wire of Test No. 21, when used as the saw wire, gives a total of 895 wafers because of having a kerf loss of 155 μm. In contrast, the resin-coated saw wire of Test No. 8 gives a total of 952 wafers because of having a kerf loss of 135 μm, indicating that the resin-coated saw wire can contribute to significantly better production efficiency.

A resin-coated saw wire according to an embodiment of the present invention, when used typically in slicing, is resistant to reduction in diameter of the steel wire itself even after slicing, because the resin coating functions and helps the steel wire to have better abrasion resistance. Accordingly, the steel wire itself can have a further smaller diameter. Typically, assume that a resin-coated saw wire is prepared by coating a steel wire having a diameter of 110 μm on its surface with a polyurethane resin coating having a thickness of 6 μm, as in Test No. 5. This saw wire, when used to cut the workpiece, gives a total of 983 wafers because of having a kerf loss of 125 μm, contributing to further better productivity than the above-mentioned saw wire of Test No. 8. Assume that a resin-coated saw wire is prepared by coating a steel wire having a diameter of 100 μm with a polyamide-imide resin coating having a thickness of 5 μm, as in Test No. 15. This saw wire, when used to cut the workpiece, gives a total of 1016 wafers because of having a kerf loss of 115 μm, contributing to further better productivity than Test No. 5.

In contrast, the fixed-abrasive wire is believed to need an average grain size of abrasive grains of 15 μm or more so as to ensure cutting performance; and is believed to require a pull-out load therefrom of 3 to 5 times that of cutting using loose abrasive grains. In order to prevent a break, it is difficult to reduce the fixed-abrasive wire diameter down to 120 μm or less. Accordingly, further reduction in kerf loss (155 μm) in Test No. 21 is extremely difficult.

While the present invention has been described in detail with reference to preferred embodiments thereof it will be understood by those skilled in the art that various changes and modifications are possible without departing from the spirit and scope of the invention as set out in the appended claims.

The present application is based on Japanese Patent Application No. 2011-179183 filed on Aug. 18, 2011, the entire contents of which are incorporated herein by reference.

INDUSTRIAL APPLICABILITY

The resin-coated saw wire according to the present invention includes a steel wire (base wire) containing substantially no abrasive grain on its surface, but being covered with a resin coating having a hardness controlled to a predetermined level. The resin-coated saw wire can cut a workpiece while introducing abrasive grains in a direction in which the resin-coated saw wire cuts the workpiece, but preventing the abrasive grains from coming into between the cut surface and the resin-coated saw wire by the action of the resin coating. This suppresses the formation of a damaged layer in a cut article surface. The resin-coated saw wire, when used to cut the workpiece, can reduce the surface roughness of the workpiece cut surface and can thereby give a cut article having a smooth surface. This eliminates the need of providing, as a downstream step, an etching step for removing the damaged layer and for smoothing the surface and contributes to better productivity of the cut article.

In addition, the resin-coated saw wire according to the present invention, when used to cut the workpiece, suppresses the introduction of abrasive grains into between the cut surface and the resin-coated saw wire, can thereby reduce the kerf loss for the workpiece, and contributes to better productivity of the cut article. The resin-coated saw wire can reduce the workpiece total thickness variation (TTV) which is one of indices of flatness.

The invention claimed is:

1. A resin-coated saw wire, comprising:
a steel wire; and
a resin coating covering a surface of the steel wire, comprising substantially no abrasive grain, and having a hardness of 0.07 GPa or more at 120° C.,
wherein:
the hardness of the resin coating is adapted to resist intrusion of abrasive grains into the resin coating, where the abrasive grains are sprayed during cutting of a workpiece.

2. The resin-coated saw wire according to claim 1, wherein the resin coating has a thickness of from 2 to 15 μm.

3. The resin-coated saw wire according to claim 1, wherein the steel wire has a diameter of 130 μm or less.

4. The resin-coated saw wire according to claim 2, wherein the steel wire has a diameter of 130 μm or less.

5. The resin-coated saw wire according to claim 1, wherein the resin coating comprises at least one resin selected from the group consisting of a polyurethane, a polyamide-imide, and a polyimide.

6. The resin-coated saw wire according to claim 2, wherein the resin coating comprises at least one resin selected from the group consisting of a polyurethane, a polyamide-imide, and a polyimide.

7. The resin-coated saw wire according to claim 3, wherein the resin coating comprises at least one resin selected from the group consisting of a polyurethane, a polyamide-imide, and a polyimide.

8. The resin-coated saw wire according to claim 4, wherein the resin coating comprises at least one resin selected from the group consisting of a polyurethane, a polyamide-imide, and a polyimide.

9. A cut article obtained by a process comprising:
cutting a workpiece by spraying abrasive grains on the resin-coated saw wire of claim 1; and
introducing the abrasive grains in a direction into which the resin-coated saw wire cuts the workpiece while preventing, with the resin coating, the abrasive grains from coming into between a cut surface of the workpiece and the resin-coated saw wire,
wherein a damaged layer in the workpiece cut surface has a depth of 5 μm or less.

10. The cut article according to claim 9, wherein the workpiece cut surface has a surface roughness of 0.5 μm or less.

11. The cut article according to claim 9, wherein a kerf loss of the workpiece is from 1 to 1.10 times a diameter of the resin-coated saw wire.

12. The cut article according to claim 10, wherein a kerf loss of the workpiece is from 1 to 1.10 times a diameter of the resin-coated saw wire.

13. The cut article according to claim 9, having a total thickness variation (TTV) of 20 μm or less.

14. The cut article according to claim 10, having a total thickness variation (TTV) of 20 μm or less.

15. The cut article according to claim 11, having a total thickness variation (TTV) of 20 μm or less.

16. The cut article according to claim 12, having a total thickness variation (TTV) of 20 μm or less.

17. The resin-coated saw wire according to claim 1, wherein the resin coating has a hardness of 0.1 GPa or more at 120° C.

18. The resin-coated saw wire according to claim 1, wherein the resin coating has a hardness of 0.5 GPa or less at 120° C.

19. The resin-coated saw wire according to claim 1, wherein the resin coating has a hardness of 0.4 GPa or less at 120° C.

\* \* \* \* \*